US012606901B2

(12) United States Patent
Ahn et al.

(10) Patent No.: US 12,606,901 B2
(45) Date of Patent: Apr. 21, 2026

(54) DEPOSITION APPARATUS

(71) Applicant: Samsung Display Co., Ltd., Yongin-si (KR)

(72) Inventors: Junghyun Ahn, Yongin-si (KR); Jaesuk Moon, Yongin-si (KR); Seungjin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 391 days.

(21) Appl. No.: 18/323,346

(22) Filed: May 24, 2023

(65) Prior Publication Data

US 2024/0026520 A1 Jan. 25, 2024

(30) Foreign Application Priority Data

Jul. 22, 2022 (KR) ........................ 10-2022-0090829

(51) Int. Cl.
| | |
|---|---|
| *C23C 14/04* | (2006.01) |
| *C23C 14/24* | (2006.01) |
| *H10K 59/12* | (2023.01) |
| *H10K 71/16* | (2023.01) |

(52) U.S. Cl.
CPC ............ *C23C 14/042* (2013.01); *C23C 14/24* (2013.01); *H10K 59/1201* (2023.02); *H10K 71/166* (2023.02)

(58) Field of Classification Search
None
See application file for complete search history.

(56) References Cited

U.S. PATENT DOCUMENTS

| | | | | |
|---|---|---|---|---|
| 5,196,745 | A * | 3/1993 | Trumper | ............ G03F 7/70716 |
| | | | | 318/135 |
| 9,016,234 | B2 | 4/2015 | Ko | |
| 9,524,891 | B2 | 12/2016 | You et al. | |
| 9,765,428 | B2 | 9/2017 | Han | |
| 2005/0077786 | A1 * | 4/2005 | De Weerdt | ............ H02K 41/03 |
| | | | | 355/72 |
| 2010/0025237 | A1 * | 2/2010 | Kim | ...................... C23C 14/042 |
| | | | | 204/298.18 |
| 2016/0248049 | A1 | 8/2016 | Hong et al. | |
| 2018/0062079 | A1 * | 3/2018 | Ko | .......................... C23C 14/12 |

(Continued)

FOREIGN PATENT DOCUMENTS

| | | | | |
|---|---|---|---|---|
| CN | 107557730 B | 8/2020 | | |
| JP | 6931851 B2 * | 9/2021 | ............ | C23C 14/24 |
| KR | 10-2016-0104194 A | 9/2016 | | |

(Continued)

OTHER PUBLICATIONS

English translation WO 2016007214, Jan. 14, 2016, Vercesi (Year: 2016).*

*Primary Examiner* — Keath T Chen
(74) *Attorney, Agent, or Firm* — Womble Bond Dickinson (US) LLP

(57) ABSTRACT

Disclosed is a deposition apparatus comprising a mask frame having a frame shape, masks on the mask frame, a magnet plate on the masks, rotating parts connected to a lower portion of the magnet plate, and magnet units connected to the rotating parts, and configured to be rotated by the rotating parts such that polarities of the magnet units are arranged in a direction crossing an extension direction of the masks.

21 Claims, 34 Drawing Sheets

(56) References Cited

U.S. PATENT DOCUMENTS

2021/0164092 A1\*  6/2021  Vergöhl  ................ C23C 14/352
2022/0093864 A1    3/2022  Moon et al.

FOREIGN PATENT DOCUMENTS

KR       10-1810683 B1   12/2017
KR       10-2081254 B1    4/2020
KR       10-2311586 B1   10/2021
WO    WO 2016/007214 A1    1/2016

\* cited by examiner

FIG. 4C

PDA

DU

MH1 MH2 RSB

MGU2 MGU1 RU2 RU1

MG

SM

CP

SUB
MM1
MFS
OP

DR3
DR1
DR2

DEPOSITION APPARATUS

CROSS-REFERENCE TO RELATED APPLICATIONS

This application claims priority to, and the benefit of, Korean Patent Application No. 10-2022-0090829 filed on Jul. 22, 2022, in the Korean Intellectual Property Office, the disclosures of which are incorporated by reference herein in their entireties.

BACKGROUND

1. Field

Embodiments of the present disclosure described herein relate to a deposition apparatus.

2. Description of Related Art

An organic light-emitting diode display (OLED), which has excellent luminance characteristics and viewing-angle characteristics, and which does not require a separate light source (unlike a liquid crystal display device), attracts a lot of attention as a next-generation flat panel display device. Because the organic light-emitting diode display does not require a separate light source, the organic light-emitting diode display may be manufactured to be relatively light and thin. In addition, the organic light-emitting diode display has characteristics such as low power consumption, high luminance, high response speed, and the like.

The organic light-emitting diode display includes a plurality of organic light-emitting elements, each of which includes an anode, an organic light-emitting layer, and a cathode. Holes and electrons are injected into the organic light-emitting layers from the anodes and the cathodes to form excitons, and the organic light-emitting elements emit light as the excitons transition to a ground state.

In the manufacture of the organic light-emitting elements, a mask is located on a substrate, and an organic material for forming the organic light-emitting layers is provided onto the substrate through openings of the mask. Because the mask includes metal and is manufactured to be very thin, the mask may not remain flat. A fixing frame for fixing the mask, and magnet units for attracting the mask to the substrate in a flat state, are used to make the mask flat. The magnet units are fixed to a magnet plate.

However, when the mask is located to be substantially parallel to the magnet units, a repulsive force may be generated between the magnet units and the mask. In this case, the mask may not be normally attracted flat to the substrate.

SUMMARY

Embodiments of the present disclosure provide a deposition apparatus in which magnet units rotate depending on an arrangement direction of masks.

According to one or more embodiments, a deposition apparatus includes a mask frame having a frame shape, masks on the mask frame, a magnet plate on the masks, rotating parts connected to a lower portion of the magnet plate, and magnet units connected to the rotating parts, and configured to be rotated by the rotating parts such that polarities of the magnet units are arranged in a direction crossing an extension direction of the masks.

The magnet units may include first magnet units having a first polarity, and second magnet units having a second polarity that is different from the first polarity.

The second magnet units may be on, and may be connected to, the first magnet units, respectively.

The first magnet units and the second magnet units may be configured to be rotated by the rotating parts to face the masks.

When the masks are arranged in a first direction, and extend in a second direction crossing the first direction, the first magnet units facing the masks may be arranged in the first direction by the rotating parts, and the second magnet units facing the masks may be spaced apart from the first magnet units in the second direction and may be arranged in the first direction.

When the masks extend in a first direction and are arranged in a second direction crossing the first direction, the first magnet units facing the masks may be arranged in the second direction by the rotating parts, and the second magnet units facing the masks may be spaced apart from the first magnet units in the first direction may be arranged in the second direction.

Each of the rotating parts may be configured to rotate a respective pair of first and second magnet units stacked on each other about a first rotational axis extending substantially perpendicularly to a plane.

Each of the rotating parts may be configured to rotate the respective pair of the first and second magnet units about a second rotational axis extending substantially parallel to the plane.

Each of the rotating parts may include a first rotating unit connected to the magnet plate, and configured to rotate the respective pair of the first and second magnet units about the first rotational axis, and second rotating units connected to the first rotating unit, and configured to rotate the respective pair of the first and second magnet units about the second rotational axis.

The first rotating unit may be in a first depression defined on a lower surface of the magnet plate, and may be connected to the magnet plate, wherein the respective pair of the first and second magnet units is in a second depression defined on a lower surface of the first rotating unit, and wherein the second rotating units are respectively connected to opposite sides of the first rotating unit, and to opposite sides of the respective pair of the first and second magnet units.

The masks may include cell regions each having a periphery that overlaps central portions of some of the first and second magnet units.

The second magnet units may be connected to sides of the first magnet units, respectively, wherein the first magnet units and the second magnet units are facing the masks.

When the masks are arranged in a first direction, and extend in a second direction crossing the first direction, the first magnet units and the second magnet units may be arranged in the first direction by the rotating parts.

When the masks are arranged in a second direction, and extend in a first direction crossing the second direction, the first magnet units and the second magnet units may be arranged in the second direction by the rotating parts.

The rotating parts may be configured to rotate a pair of the first and second magnet units, which are connected with each other, about a rotational axis that is substantially perpendicular to a plane.

An $h^{th}$ pair of the first and second magnet units that are connected with each other, and an $(h+1)^{th}$ pair of the first and second magnet units that are connected with each other, may be configured to rotate in different respective directions, h being a natural number.

The $h^{th}$ pair of the first and second magnet units and the $(h+1)^{th}$ pair of the first and second magnet units may be located such that magnet units having a same polarity face each other.

Each of the magnet units may have a square shape, sides of which have a length of about 10 mm, and a distance between one side of an $h^{th}$ magnet unit and one side of an $(h+1)^{th}$ magnet unit is about 14.2 mm.

According to one or more embodiments, a deposition apparatus includes a mask frame having a frame shape, masks on the mask frame, a magnet plate on the masks, a rotating part connected to a lower portion of the magnet plate, and magnet units connected to the rotating part, and configured to be rotated by the rotating part, wherein, on a plane, the rotating part is configured to rotate the magnet units about a first rotational axis extending substantially perpendicularly to the plane, and about a second rotational axis extending substantially parallel to the plane.

The magnet units may be configured to be rotated by the rotating part such that polarities of the magnet units are arranged in a direction crossing an extension direction of the masks.

According to one or more embodiments, a deposition apparatus includes a mask frame having a frame shape, masks on the mask frame, a magnet plate on the masks, a rotating part connected to a lower portion of the magnet plate, and magnet units connected to the rotating part, and configured to be rotated by the rotating part, wherein the rotating part is configured to rotate the magnet units about a rotational axis extending substantially perpendicularly to a plane, and wherein the rotating part is configured to rotate the magnet units such that polarities of the magnet units are arranged in a direction crossing an extension direction of the masks.

BRIEF DESCRIPTION OF THE DRAWINGS

The above and other aspects of the present disclosure will become apparent by describing in detail embodiments thereof with reference to the accompanying drawings.

FIGS. 4A to 4H are views for describing a deposition method of a substrate using the deposition apparatus illustrated in FIG. 1.

DETAILED DESCRIPTION

Figure 1:
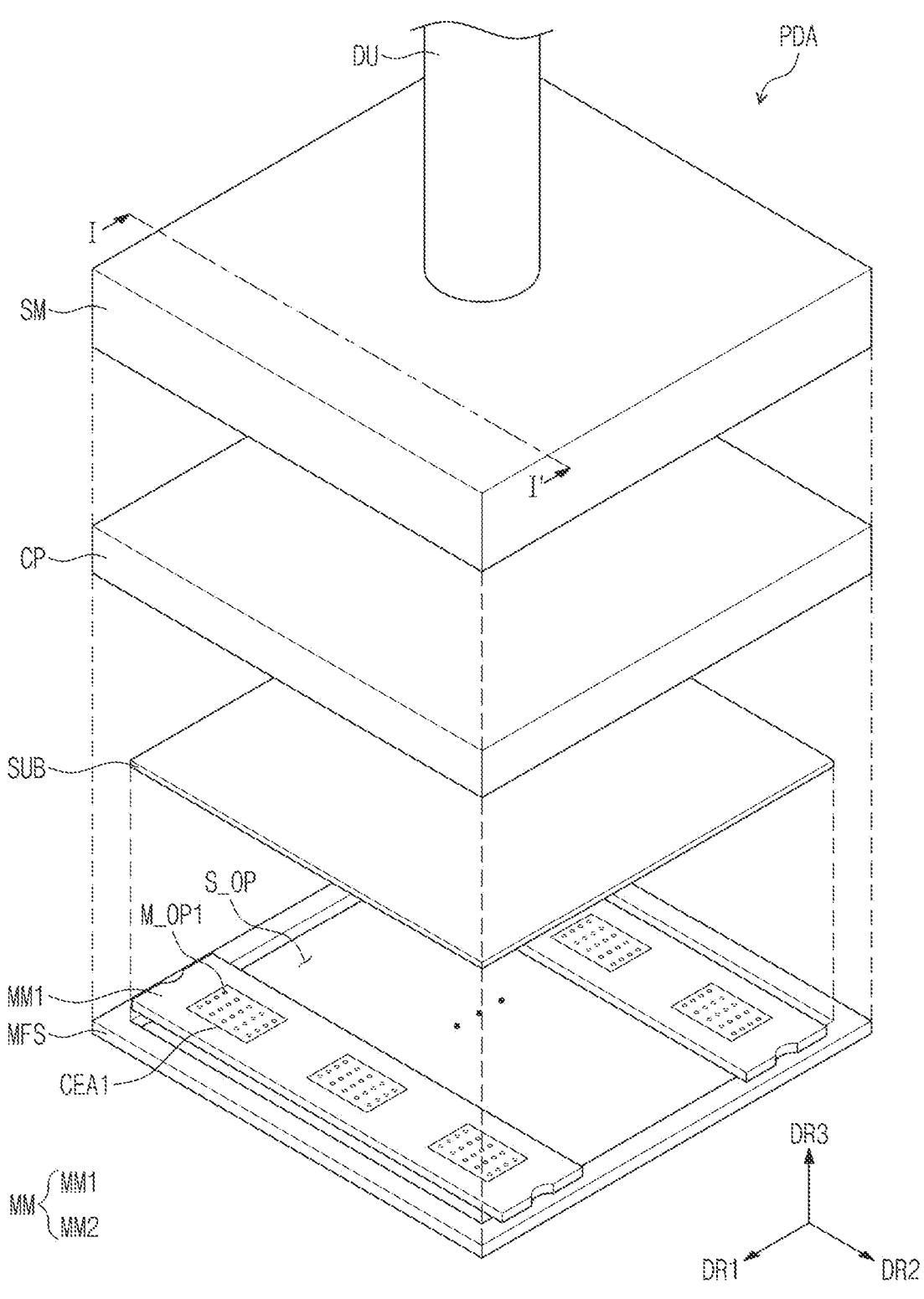
FIG. 1 is a perspective view of a deposition apparatus according to one or more embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression such as "at least one of A and B" and "at least one of A or B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be substantially perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a deposition apparatus according to one or more embodiments of the present disclosure.

Referring to FIG. 1, the deposition apparatus PDA may include a mask frame MFS, a plurality of masks MM, a cooling plate CP, a magnet plate SM, and a drive unit DU.

The mask frame MFS may have a rectangular shape having side surfaces extending in a first direction DR1, and side surfaces extending in a second direction DR2 crossing the first direction DR1. The mask frame MFS may have a rectangular frame shape. However, the shape of the mask frame MFS is not limited thereto.

The mask frame MFS may have a mask opening S_OP defined therein. The mask opening S_OP may have a rectangular shape. However, the shape of the mask opening S_OP is not limited thereto.

The mask frame MFS may include a metallic material. For example, the mask frame MFS may include Invar®, which is a registered trademark of Aperam Alloys Imphy, or stainless steel.

Hereinafter, a direction crossing a plane defined by the first and second directions DR1 and DR2 is defined as a third direction DR3. The third direction DR3 may substantially perpendicularly cross the plane defined by the first and second directions DR1 and DR2. As used herein, the expression "when viewed on the plane" may mean that it is viewed in the third direction DR3.

The masks MM may be located on the mask frame MFS. Opposite sides of the masks MM may be connected to the mask frame MFS. For example, the masks MM may be connected to the mask frame MFS by laser welding.

The masks MM may be arranged in the first direction DR1, and may extend in the second direction DR2. However, without being limited thereto, the masks MM may be arranged in the second direction DR2, and may extend in the first direction DR1.

Hereinafter, the masks MM are differently defined depending on arrangement states. For example, the masks MM arranged in the first direction DR1 and extending in the second direction DR2 will be defined as first masks MM1. Furthermore, the masks MM arranged in the second direction DR2 and extending in the first direction DR1 will be defined as second masks MM2 (e.g., see FIG. 5). The masks MM illustrated in FIG. 1 are defined as the first masks MM1. The second masks MM2 will be illustrated in FIG. 5. Hereinafter, the structure of one first mask MM1 will be described as an example. The second mask MM2 illustrated in FIG. 5 may have the same structure as the first mask MM1, differing only in the arrangement state.

The first mask MM1 may include metal. For example, the first mask may be defined as a fine metal mask. The first mask MM1 may have a rectangular shape having short sides extending in the first direction DR1, and long sides extending in the second direction DR2.

A plurality of first cell regions CEA1 may be defined on an upper surface of the first mask MM1. For example, three first cell regions CEA1 may be defined on the upper surface of the first mask MM1. However, the number of first cell regions CEA1 is not limited thereto. The first cell regions CEA1 may be arranged in the second direction DR2. The first cell regions CEA1 may be located to overlap the mask opening S_OP when viewed on the plane.

The first cell regions CEA1 may have a polygonal shape. For example, the first cell regions CEA1 may have a rectangular shape having long sides extending in the second direction DR2, and short sides extending in the first direction DR1. Each of the first cell regions CEA1 may have a plurality of first cell openings M_OP1 defined therein. The first cell openings M_OP1 may be arranged in the first direction DR1 and the second direction DR2. The first cell openings M_OP1 may overlap the mask opening S_OP when viewed on the plane.

A substrate SUB may be located on the first masks MM1. The substrate SUB may be supported by the first masks MM1.

In one or more embodiments, a crucible having a deposition material accommodated therein may be located under the mask frame MFS. The deposition material may be gasified by heating the crucible, and the gasified deposition material may be provided to the substrate SUB through the mask opening S_OP. Detailed description thereabout will be given below with reference to FIG. 14.

The cooling plate CP may be located over the mask frame MFS and the first mask MM1. The cooling plate CP may have a flat plate shape defined by the first direction DR1 and the second direction DR2. The cooling plate CP may have a hexahedron shape including an upper surface and a lower surface defined by the first direction DR1 and the second direction DR2. However, without being limited thereto, the cooling plate CP may have various shapes.

In one or more embodiments, a pipe in which cooling water flows may be located inside the cooling plate CP. In a deposition process, the substrate SUB may be located between the masks MM and the cooling plate CP, and may be brought into contact with the masks MM and the cooling plate CP. In the deposition process, the substrate SUB may be thermally deformed when the substrate SUB is heated by the heated deposition material. However, the cooling water may be supplied into the cooling plate CP brought into contact with the substrate SUB, and the heated substrate SUB may be cooled by the cooling water. Accordingly, the substrate SUB may be prevented from being thermally deformed by the heated deposition material.

The magnet plate SM may be located on the cooling plate CP. The magnet plate SM may have a flat shape defined by the first direction DR1 and the second direction DR2. The magnet plate SM may have a hexahedron shape including an upper surface and a lower surface defined by the first direction DR1 and the second direction DR2. However, without being limited thereto, the magnet plate SM may have various shapes.

Magnet units MG and rotating parts RP, which will be described below with reference to FIG. 2, may be located on the lower surface of the magnet plate SM. The magnet units MG and the rotating parts RP will be described in detail with reference to FIG. 2.

The drive unit DU may be located on the magnet plate SM. The magnet plate SM may be connected to the drive unit DU. The drive unit DU may have a cylindrical shape extending in the third direction DR3. However, without being limited thereto, the drive unit DU may have various shapes. The drive unit DU may reciprocate in the third direction DR3 to reciprocate the magnet plate SM in the third direction DR3.

Figure 2:
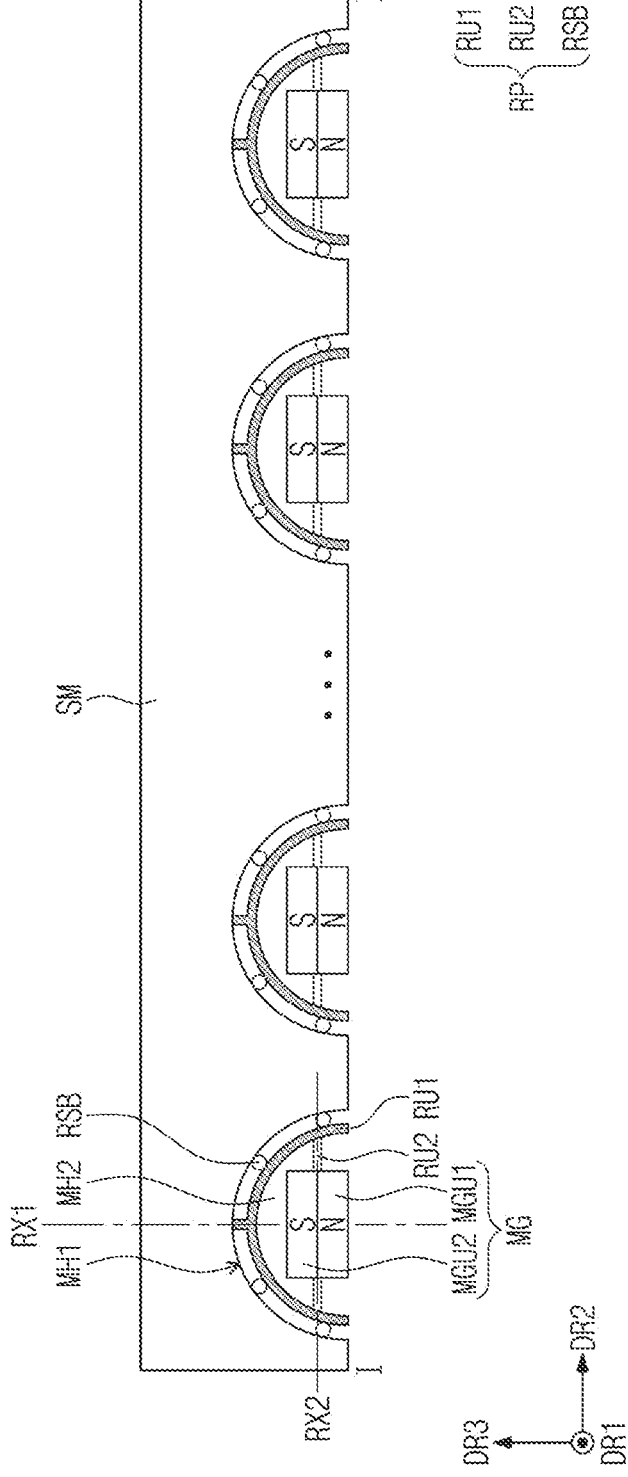
FIG. 2 is a sectional view of a magnet plate taken along the line I-I' illustrated in FIG. 1.
Figure 3:
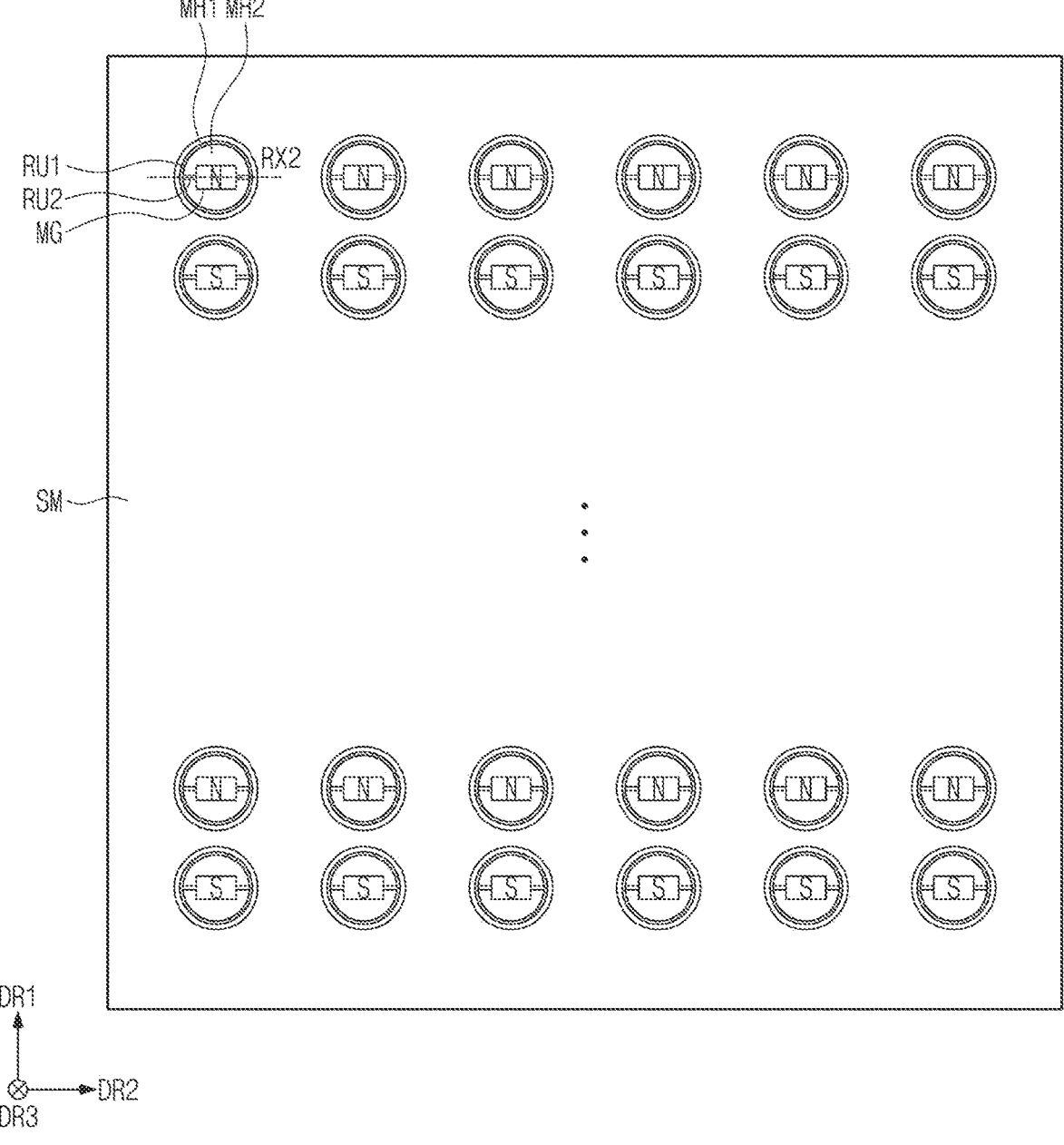
FIG. 3 is a bottom plan view of the magnet plate illustrated in FIG. 1 when viewed in a third direction.

FIG. 2 is a sectional view of the magnet plate taken along the line I-I' illustrated in FIG. 1. FIG. 3 is a bottom plan view of the magnet plate illustrated in FIG. 1 when viewed in the third direction.

Referring to FIGS. 2 and 3, the magnet plate SM may have a plurality of first depressions MH1 defined on the lower surface thereof. The lower surface of the magnet plate SM may face the masks. The first depressions MH1 may be recessed from the lower surface toward the upper surface of the magnet plate SM in the third direction DR3. The first depressions MH1 may have a concave shape.

The deposition apparatus PDA may include the plurality of rotating parts RP and the plurality of magnet units MG connected to the rotating parts RP. The rotating parts RP may be located in the first depressions MH1. The rotating parts RP may be located in a lower portion of the magnet plate SM. Each of the rotating parts RP may include a first rotating unit RU1, second rotating units RU2, and a plurality of rotating balls RSB. Hereinafter, one of the rotating parts RP will be described.

The first rotating unit RU1 of the rotating part RP may be located in the first depression MH1 defined on the lower surface of the magnet plate SM. The first rotating unit RU1 may have a shape convex in the third direction DR3 toward the upper surface of the magnet plate SM.

The first rotating unit RU1 may be connected to the magnet plate SM. The first rotating unit RU1 connected to the magnet plate SM may rotate about a first rotational axis RX1 that is substantially parallel to the third direction DR3. The first rotational axis RX1 may be substantially perpendicular to the plane defined by the first direction DR1 and the second direction DR2. The first rotating unit RU1 may have a second depression MH2 defined on a lower surface thereof. The second depression MH2 may be recessed toward the upper surface of the magnet plate SM in the third direction DR3. The second depression MH2 may have a concave shape. A corresponding one of the magnet units MG may be located in the second depression MH2. Hereinafter, a configuration of one magnet unit MG will be described.

The magnet units MG may have a rectangular shape when viewed on the plane. The magnet units MG may be located such that long sides are substantially parallel to the second direction DR2. The magnet unit MG may include a magnetic material having a magnetic force. The magnet unit MG may include a first magnet unit MGU1 having a first polarity, and a second magnet unit MGU2 having a second polarity. For example, the first polarity may be defined as an N pole, and the second polarity may be defined as an S pole.

The magnet units MG facing the masks MM are illustrated in FIG. 3. The first magnet unit MGU1 and the second magnet unit MGU2 may be brought into contact with each other (or, connected with each other) in the third direction DR3. The first magnet units MGU1 of some magnet units MG among the magnet units MG may be located below to face the mask MM of FIG. 1. The second magnet units MGU2 of other magnet units MG among the magnet units MG may be located below to face the mask MM of FIG. 1. In the magnet units MG located in odd-numbered rows based on FIG. 3, the first magnet units MGU1 may face the masks MM. In the magnet units MG located in the odd-numbered rows based on FIG. 3, the second magnet units MGU2 are located to face toward the magnet plate SM. In the magnet units MG located in even-numbered rows based on FIG. 3, the second magnet units MGU2 may face the masks MM. In the magnet units MG located in the even-numbered rows based on FIG. 3, the first magnet units MGU1 are located to face toward the magnet plate SM. The rows may correspond to the second direction DR2.

The second rotating units RU2 may extend in the second direction DR2. A pair of second rotating units RU2 may be located in the second depression MH2.

The magnet unit MG may be connected to the first rotating unit RU1 by the second rotating units RU2. The second rotating units RU2 may be respectively located between the magnet unit MG and the first rotating unit RU1 inside the second depression MH2, and may connect the magnet unit MG and the first rotating unit RU1.

The second rotating units RU2 may be respectively connected to opposite sides of the magnet unit MG, which face away from each other in the second direction DR2. The second rotating units RU2 may rotate about a second rotational axis RX2. The second rotational axis may be defined to be substantially parallel to the first direction DR1 or the second direction DR2 depending on the extension direction of the masks MM. For example, the second rotational axis RX2 that is substantially parallel to the second direction DR2 is illustrated in FIGS. 2 and 3. However, depending on the extension direction of the masks MM, the second rotational axis RX2 may be defined to be substantially parallel to the first direction DR1. This configuration will be described below in detail.

The magnet unit MG may be rotated about the first rotational axis RX1 and the second rotational axis RX2 by the first rotating unit RU1 and the second rotating units RU2. For example, when the first rotating unit RU1 rotates about the first rotational axis RX1, the second rotating units RU2 and the magnet unit MG may also be rotated about the first rotational axis RX1. Furthermore, when the second rotating units RU2 rotate about the second rotational axis RX2, the magnet unit MG connected to the second rotating units RU2 may also be rotated about the second rotational axis RX2.

The plurality of rotating balls RSB may be located between an inner surface of the magnet plate SM (on which the first depression MH1 is defined) and the first rotating unit RU1. The rotating balls RSB may be located in the first depression MH1. The rotating balls RSB may have a spherical shape. When the first rotating unit RU1 rotates about the second rotational axis RX2, the rotating balls RSB may assist in the rotation.

As illustrated in FIG. 3, the first depressions MH1, the second depressions MH2, the rotating parts RP, and the magnet units MG may be arranged on the lower surface of the magnet plate SM in the first direction DR1 and the second direction DR2.

Figure 4A:
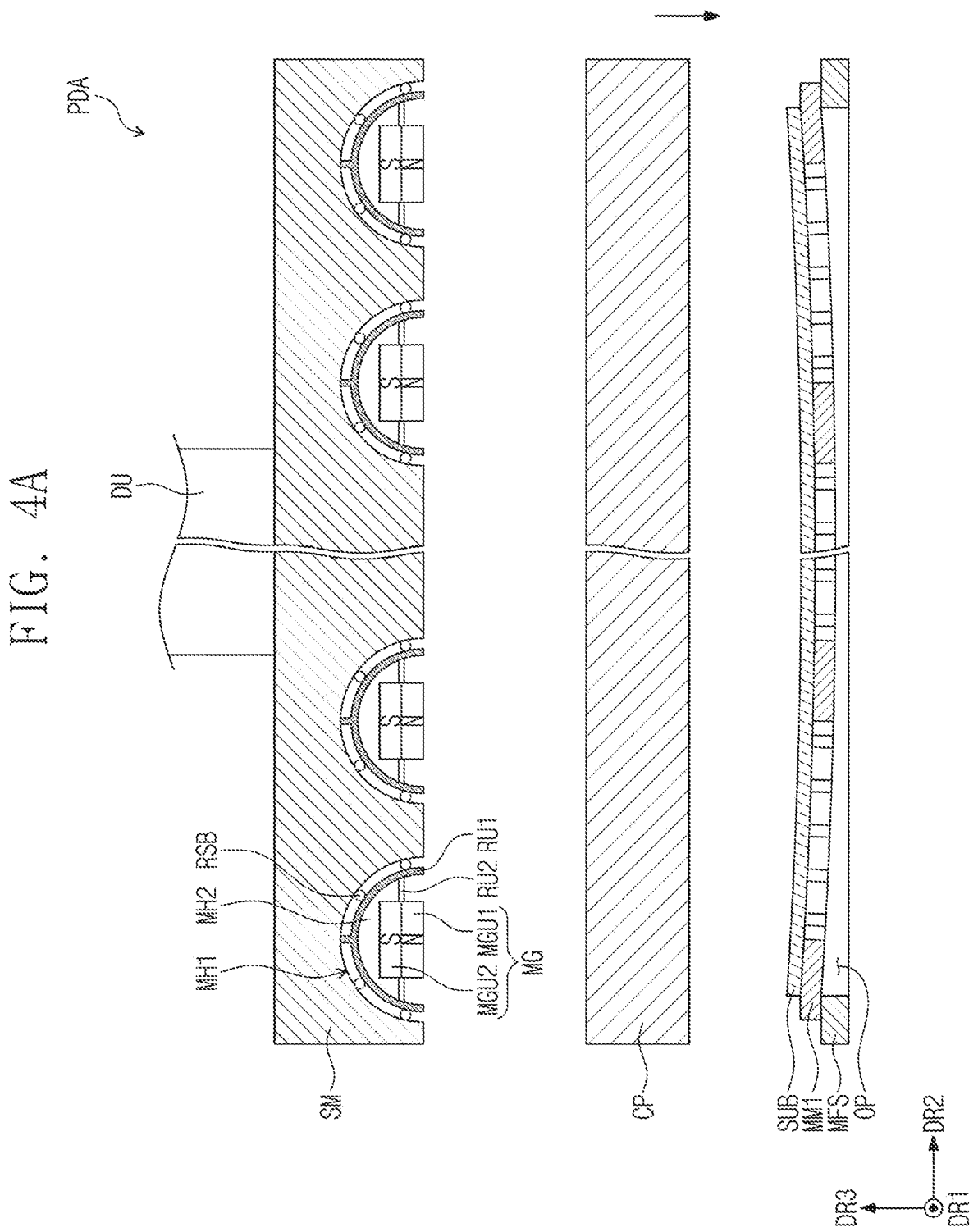
Figure 4B:
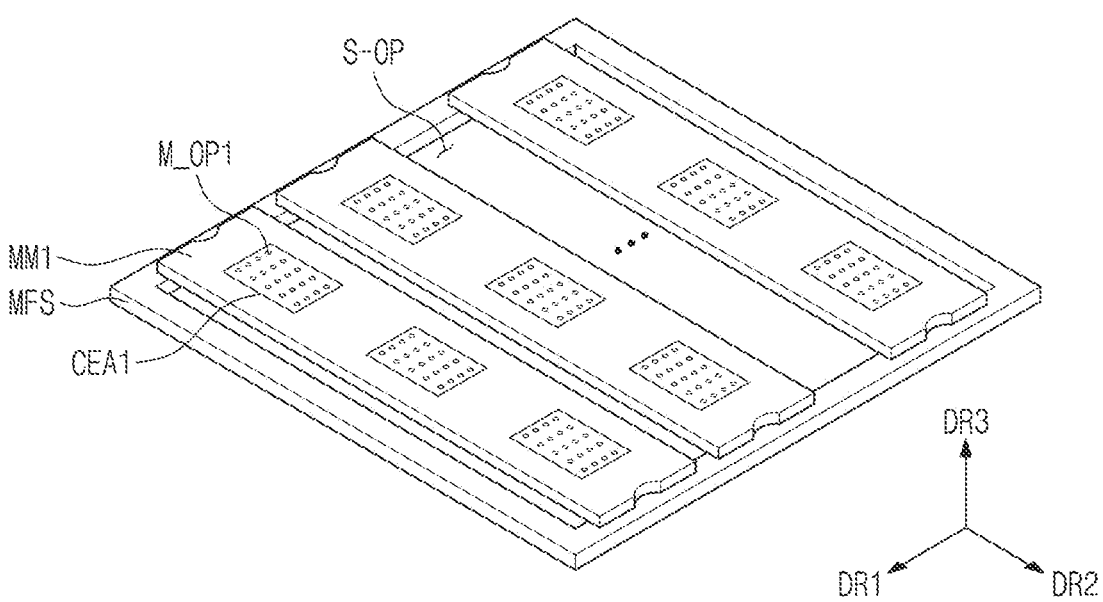
Figure 4C:
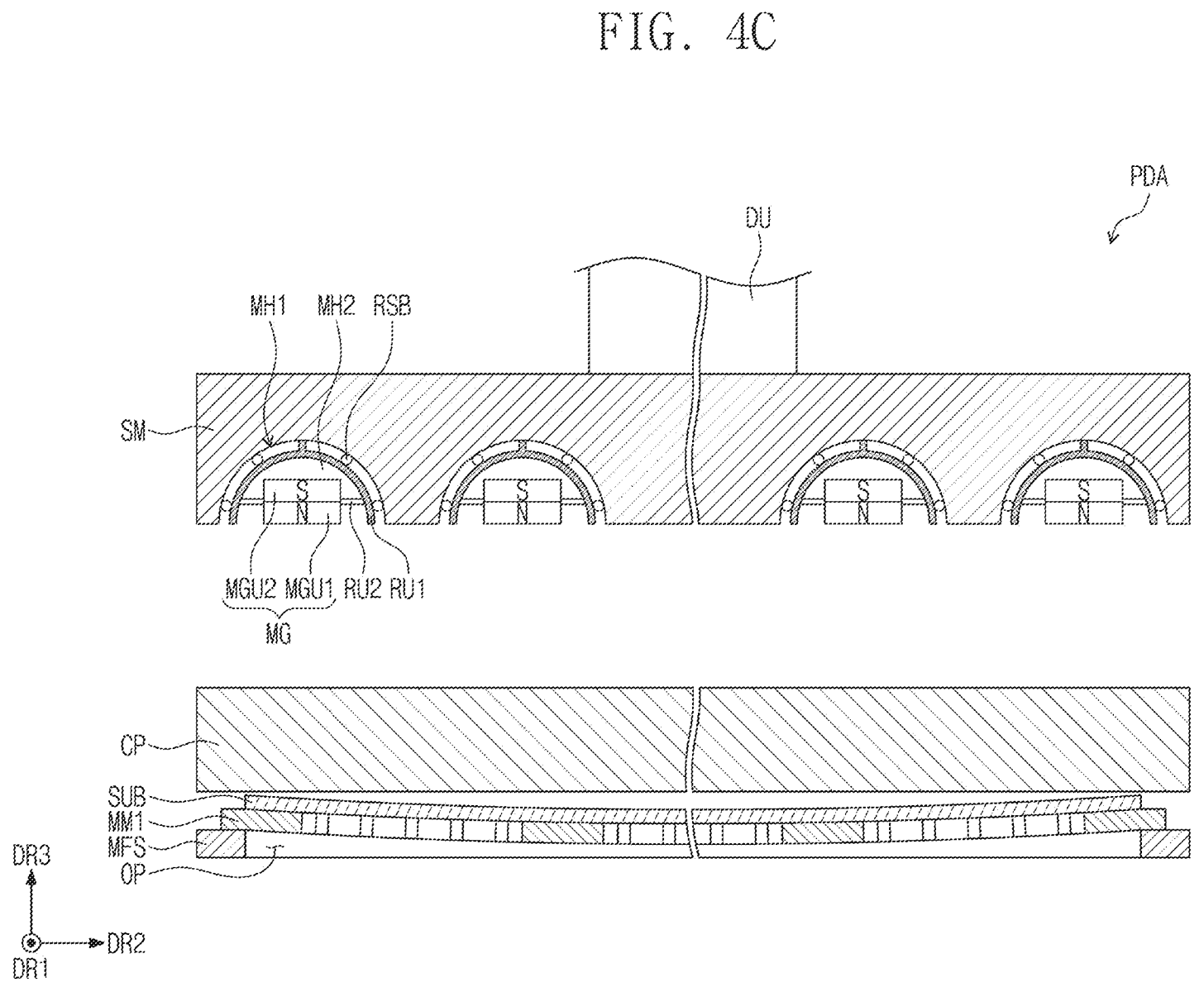
Figure 4D:
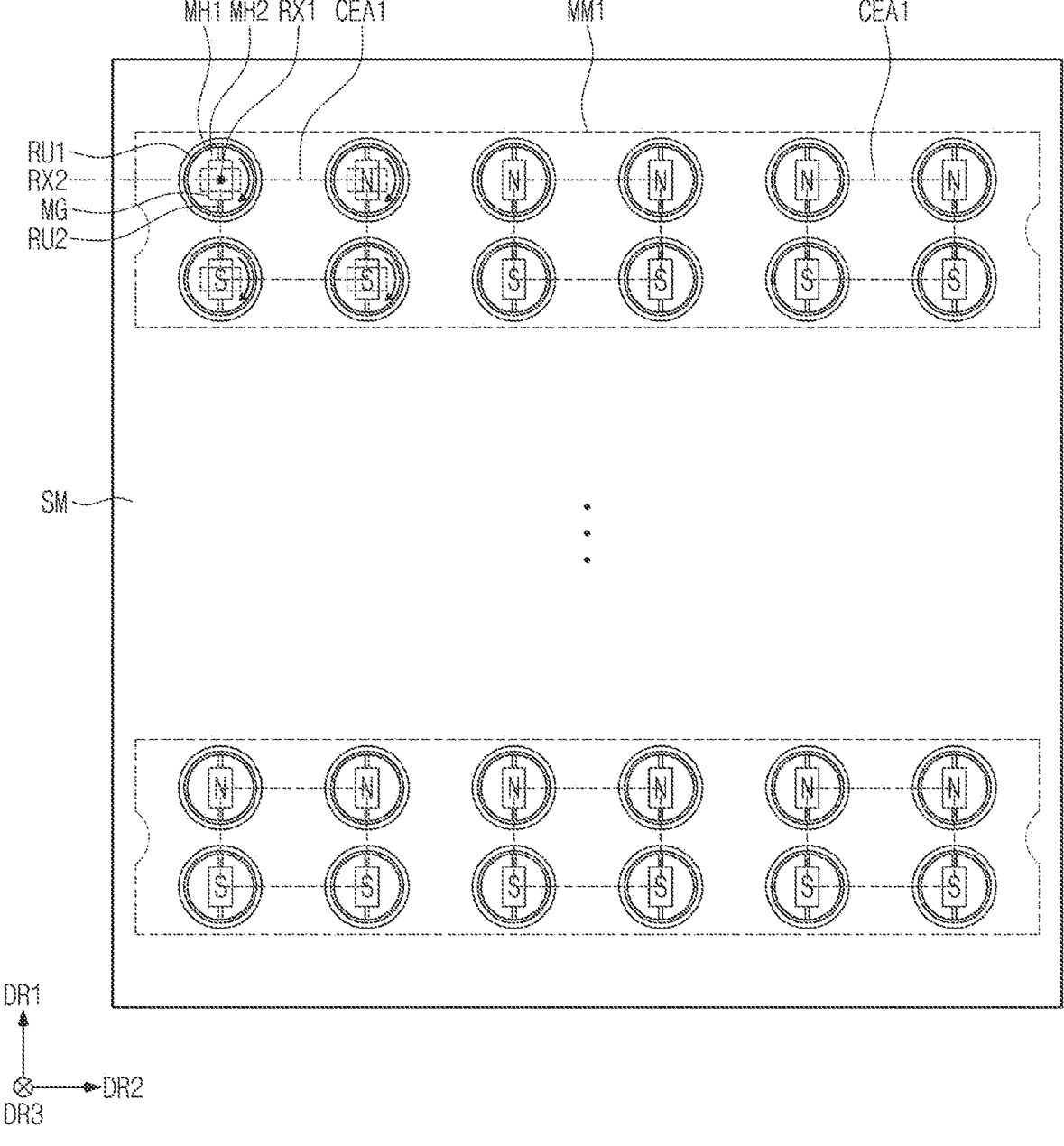
Figure 4E:
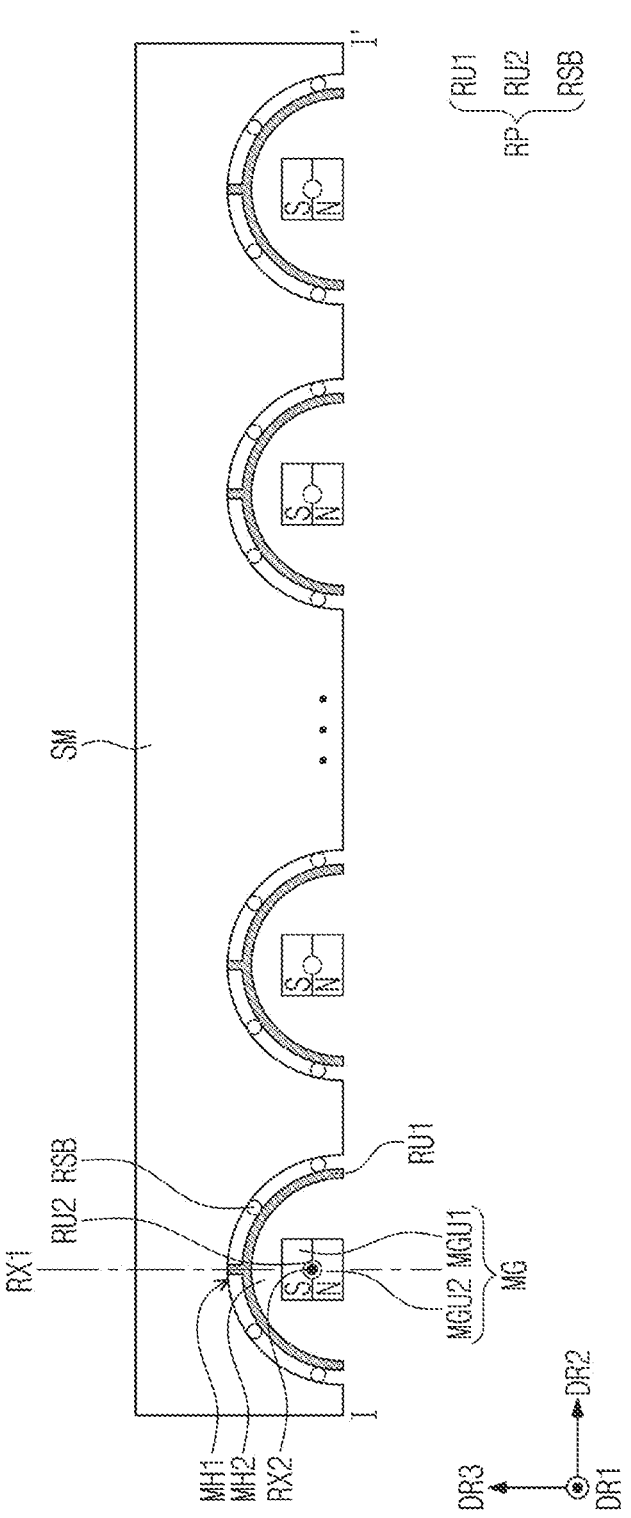
Figure 4F:
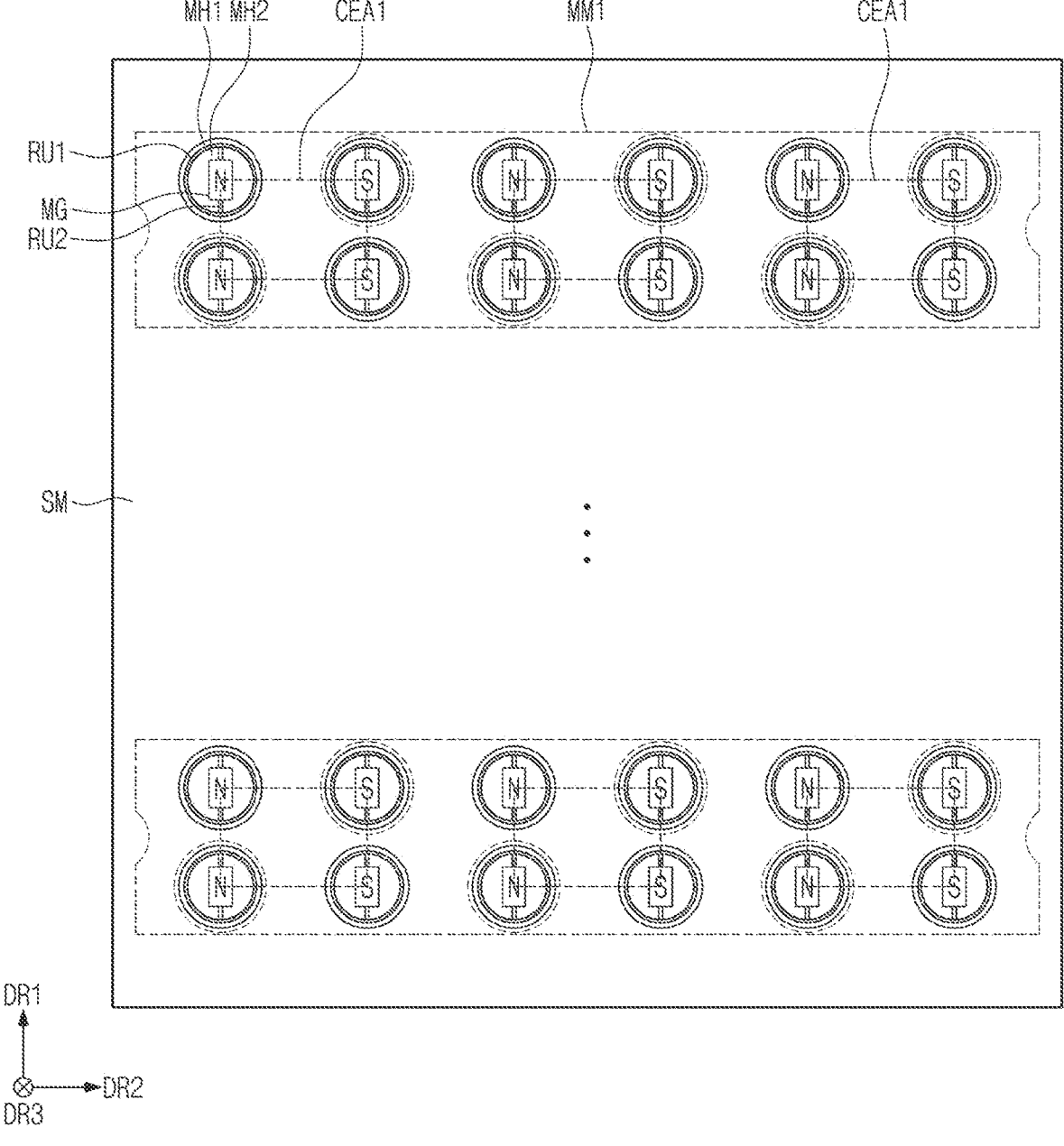
Figure 4G:
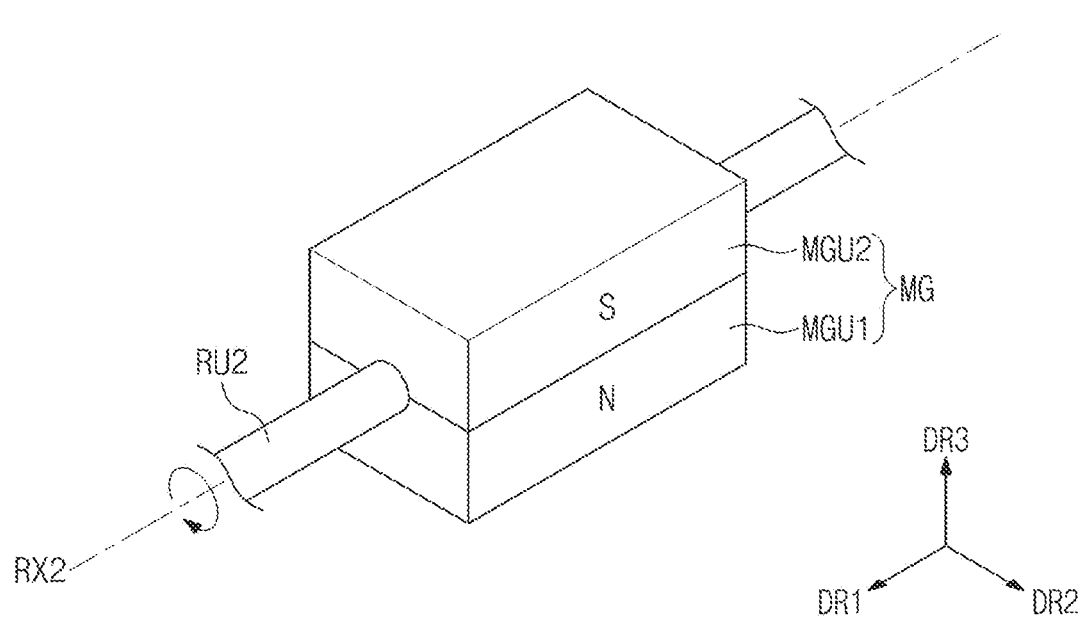

FIGS. 4A to 4H are views for describing a deposition method of a substrate using the deposition apparatus illustrated in FIG. 1. For example, FIGS. 4A, 4C, 4E, and 4H are sectional views taken along the line I-I'. FIGS. 4B and 4G are perspective views. FIGS. 4D and 4F are plan views.

Referring to FIGS. 4A and 4B, the masks MM may be fixed to the mask frame MFS, and the substrate SUB may be located on the masks MM. The substrate SUB may contact the upper surfaces of the masks MM. The substrate SUB may be located between the cooling plate CP and the masks MM, and the magnet plate SM and the magnet units MG may be located on the cooling plate CP. Accordingly, the cooling plate CP may be located between the magnet plate SM and the substrate SUB.

Because the masks MM located on the mask frame MFS extend in the second direction DR2 and are arranged in the first direction DR1, the masks MM may be defined as the first masks MM1 as described above.

The substrate SUB may be located on the mask frame MFS and the first masks MM1. The substrate SUB may be supported by the first masks MM1. When the mask frame MFS supports the substrate SUB and the first masks MM1, the mask frame MFS and the substrate SUB may sag due to the gravity.

Referring to FIG. 4C, when the substrate SUB is located on the first masks MM1, the cooling plate CP may move in the third direction DR3 and may be located adjacent to the substrate SUB. In one or more embodiments, the cooling plate CP may be reciprocated in the third direction DR3 by a motor.

Referring to FIGS. 3, 4D, and 4E, the first and second magnet units MGU1 and MGU2 facing the first masks MM1 may rotate about the first rotational axis RX1. When the cooling plate CP moves in the third direction DR3 and is adjacent to the substrate SUB, the magnet units MG may be rotated by the first rotating unit RU1 of the rotating part RP. For example, as illustrated in FIG. 3, the long sides of the magnet units MG may be arranged to be substantially parallel to the second direction DR2 before the cooling plate is located adjacent to the substrate SUB. The first rotating unit RU1 may rotate about the first rotational axis RX1 by 90 degrees after the cooling plate CP is located adjacent to the substrate SUB. For example, the first rotating unit RU1 may rotate about the first rotational axis RX1 in the clockwise direction.

When the first rotating unit RU1 rotates, the second rotating units RU2 and the magnet units MG connected to the first rotating unit RU1 may be rotated about the first rotational axis RX1 by 90 degrees. When the second rotating units RU2 and the magnet units MG are rotated about the first rotational axis RX1 by 90 degrees, the long sides of the magnet units MG may be arranged to be substantially parallel to the first direction DR1, as illustrated in FIGS. 4D and 4E. The short sides of the magnet units MG may be arranged to be substantially parallel to the second direction DR2.

The magnet units MG located in the odd-numbered rows may be located such that the first magnet units MGU1 having the first polarity face the first masks MM1. The magnet units MG located in the even-numbered rows may be located such that the second magnet units MGU2 having the second polarity face the first masks MM1. Accordingly, the first magnet units MGU1 and the second magnet units MGU2 may be respectively arranged to have the same respective polarity in the extension direction of the first masks MM1. That is, the arrangement direction of the respective polarities of the magnet units MG may be substantially parallel to the extension direction of the first masks MM1.

Referring to FIGS. 4F and 4G, the first and second magnet units MGU1 and MGU2 facing the first masks MM1 may rotate about the second rotational axis RX2. The magnet units MG may be rotated by the second rotating units RU2 such that the arrangement direction of the polarities of the magnet units MG and the extension direction of the first masks MM1 cross each other. For example, the magnet units MG may be rotated about the second rotational axis RX2 in the clockwise direction.

Some of the magnet units MG may be rotated about the second rotational axis RX2 by the second rotating units RU2. For example, among the magnet units MG located in the odd-numbered rows, magnet units MG located in even-numbered columns may be rotated about the second rotational axis RX2 by 180 degrees by the second rotating units RU2. Among the magnet units MG located in the even-numbered rows, magnet units MG located in odd-numbered columns may be rotated about the second rotational axis RX2 by 180 degrees by the second rotating units RU2. For example, the magnet units MG illustrated by the dotted/dashed-line circles may be the magnet units MG rotated about the second rotational axis RX2. The rows may correspond to the second direction DR2, and the columns may correspond to the first direction DR1.

According to the operation, the arrangement direction of the polarities of the magnet units MG facing the first masks MM1 may cross the extension direction of the first masks MM1. For example, the magnet units MG located in the odd-numbered columns to face the first masks MM1 may be located such that the first magnet units MGU1 having the first polarity face the first masks MM1. The magnet units MG located in the even-numbered columns to face the first masks MM1 may be located such that the second magnet units MGU2 having the second polarity face the first masks MM1. Accordingly, the first magnet units MGU1 and the second magnet units MGU2 may be arranged in a direction crossing the extension direction of the first masks MM1. That is, the first magnet units MGU1 may be arranged in a direction that is substantially parallel to the first direction DR1. The second magnet units MGU2 may be spaced apart from the first magnet units MGU1 in the second direction DR2 and may be arranged in a direction that is substantially parallel to the first direction DR1.

It has been described that the magnet units MG are rotated about the first rotational axis RX1 and then rotated about the second rotational axis RX2. However, without being limited thereto, the magnet units MG may be rotated about the second rotational axis RX2 and then rotated about the first rotational axis RX1, or may be concurrently or substantially simultaneously rotated about the first rotational axis RX1 and the second rotational axis RX2.

The first cell regions CEA1 of the first masks MM1 may overlap the magnet units MG. The periphery of each of the first cell regions CEA1 may overlap central portions of some of the first and second magnet units MGU1 and MGU2.

Figure 4H:
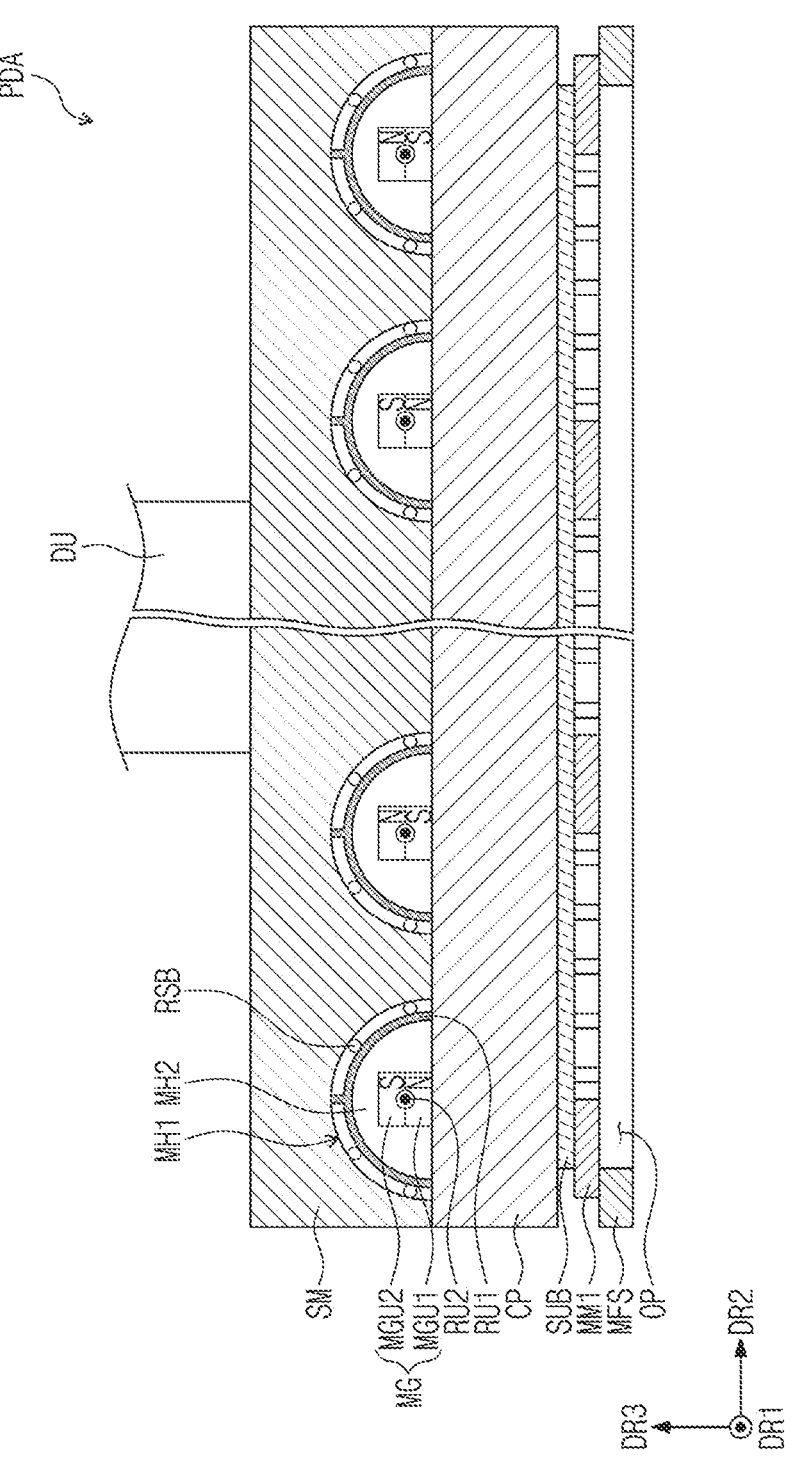

Referring to FIG. 4H, when the polarities of the magnet units MG facing the first masks MM1 are arranged to cross the extension direction of the first masks MM1, the magnet plate SM may be moved in the third direction DR3 by the drive unit DU. The magnet plate SM may be moved in the third direction DR3 and may be adjacent to the substrate SUB and the first masks MM1.

When the magnet plate SM is adjacent to the substrate SUB and the first masks MM1, an attractive force may be generated between the magnet units MG and the first masks MM1. Accordingly, the central portions of the first masks MM1 may be moved toward the magnet units MG. The substrate SUB located between the first masks MM1 and the magnet units MG may be brought into contact with the lower surface of the cooling plate CP by the first masks MM1. That is, the first masks MM1 and the substrate SUB may be spread substantially flat without sagging downward. Thereafter, a deposition process may be performed. The deposition process will be described below with reference to FIG. 14.

Figure 5:
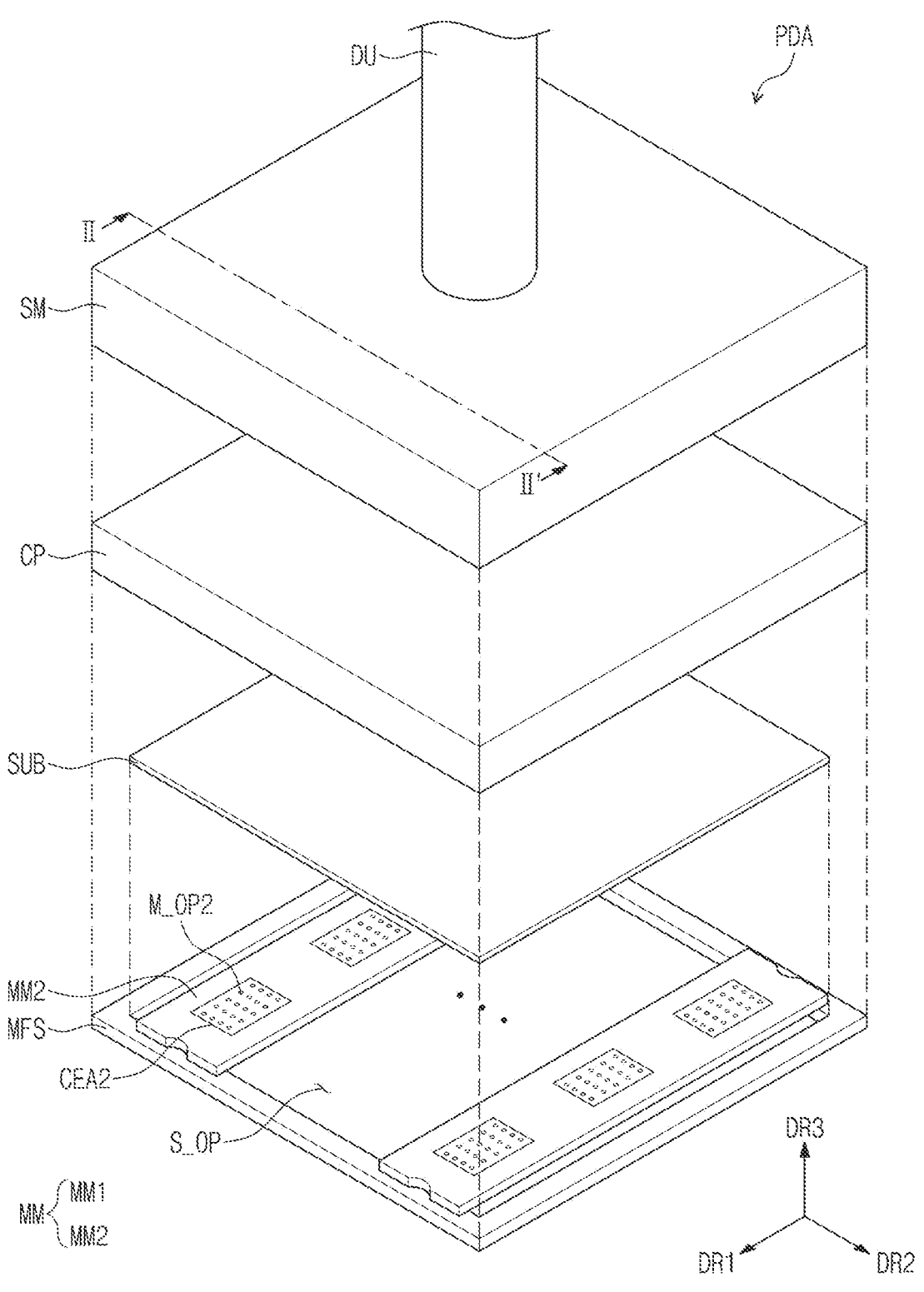
FIG. 5 is a perspective view of a deposition apparatus in which an arrangement direction of masks of FIG. 1 is changed.

FIG. 5 is a perspective view of a deposition apparatus in which the arrangement direction of the masks of FIG. 1 is changed.

A mask frame MFS, a magnet plate SM, a cooling plate CP, a rotating part RP, magnet units MG, and a drive unit DU of FIG. 5 are identical to the mask frame MFS, the magnet plate SM, the cooling plate CP, the rotating part RP, the magnet units MG, and the drive unit DU of FIG. 1, and therefore will be omitted from the description below or will be briefly described.

Referring to FIG. 5, masks MM may be located on the mask frame MFS. Because the masks MM located on the mask frame MFS extend in the first direction DR1 and are arranged in the second direction DR2, the masks MM may be defined as the second masks MM2, as described above. The second mask MM2 may have a rectangular shape having long sides extending in the first direction DR1, and short sides extending in the second direction DR2.

A plurality of second cell regions CEA2 may be defined on upper surfaces of the second masks MM2. For example, three second cell regions CEA2 may be defined on the upper surface of the second mask MM2. However, the number of second cell regions CEA2 is not limited thereto. The second cell regions CEA2 may be arranged in the first direction DR1. When viewed on the plane, the second cell regions CEA2 may be located to overlap a mask opening S_OP.

The second cell regions CEA2 may have a polygonal shape. For example, the second cell regions CEA2 may have a rectangular shape having long sides extending in the first direction DR1, and short sides extending in the second direction DR2. Each of the second cell regions CEA2 may have a plurality of second cell openings M_OP2 defined therein. The second cell openings M_OP2 may be arranged in the first direction DR1 and the second direction DR2. The second cell openings M_OP2 may overlap the mask opening S_OP when viewed on the plane.

A substrate SUB may be located on the second masks MM2. The substrate SUB may be supported by the second masks MM2.

FIGS. 6A to 6G are views for describing a deposition method of a substrate using the deposition apparatus illustrated in FIG. 5.

Figure 6A:
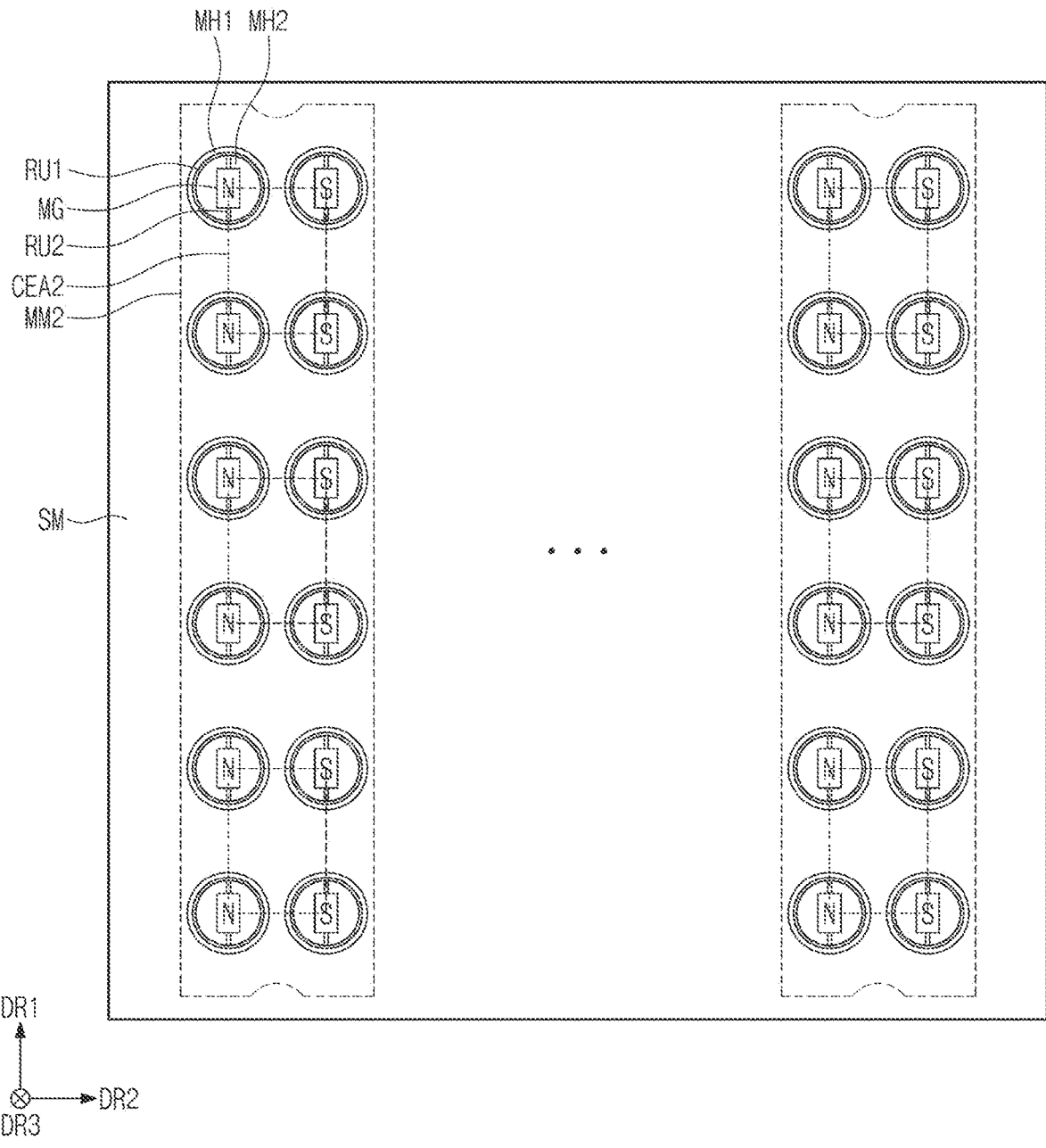
FIGS. 6A to 6G are views for describing a deposition method of a substrate using the deposition apparatus illustrated in FIG. 5.

For example, FIGS. 6B, 6D, 6F, and 6G are sectional views taken along the line II-II' of FIG. 5. FIGS. 6A, 6C, and 6E are plan views.

A process in which the mask frame MFS, the substrate SUB, and the cooling plate CP of FIGS. 6A to 6G contact each other may be substantially identical to the process in which the mask frame MFS, the substrate SUB, and the cooling plate CP of FIGS. 4A to 4C contact each other. Therefore, description thereabout will be omitted.

Figure 6B:
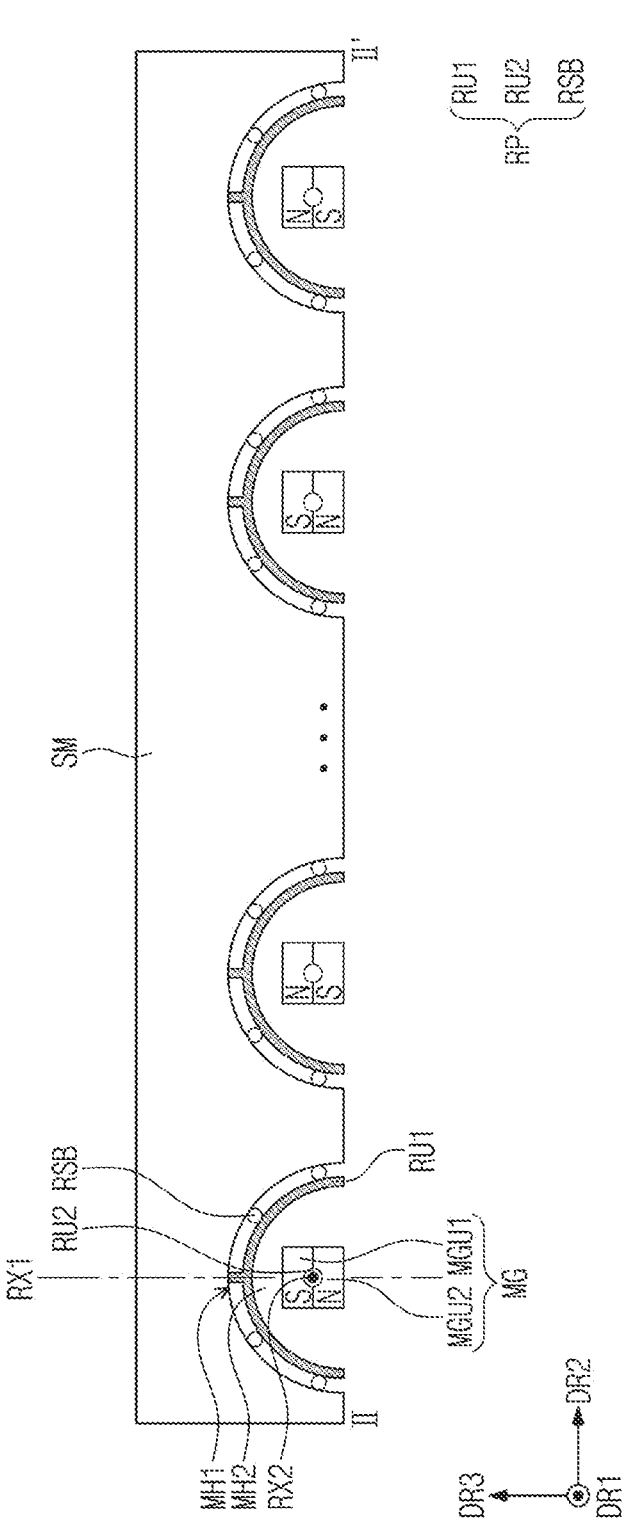
Figure 6C:
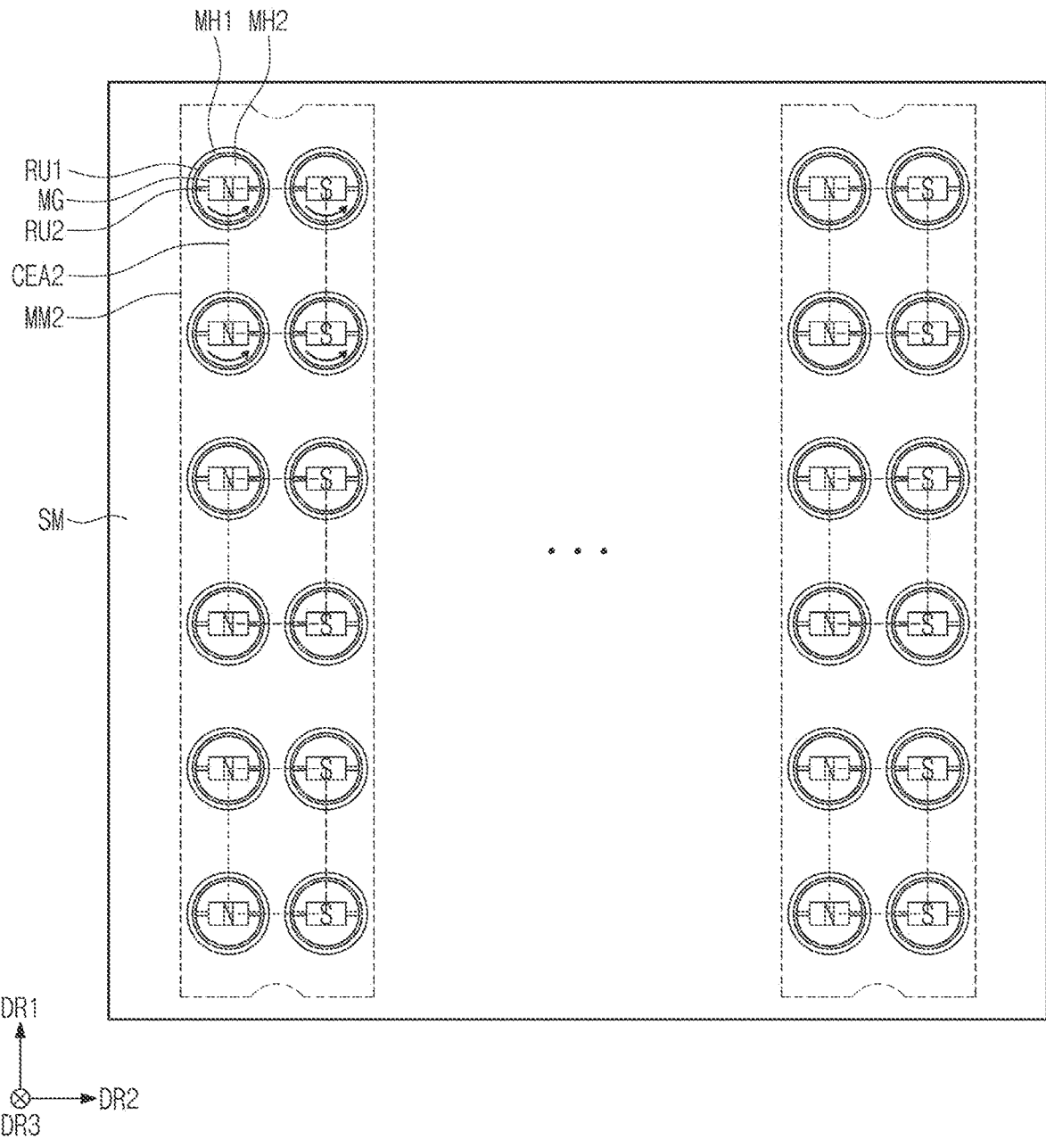

Referring to FIGS. 6A and 6B, the magnet units MG may be arranged as illustrated in FIG. 6A before the cooling plate CP is located adjacent to the substrate SUB. First magnet units MGU1 may be arranged in the first direction DR1. Second magnet units MGU2 may be arranged in the first direction DR1. The long sides of the magnet units MG may be arranged to be substantially parallel to the first direction DR1. The short sides of the magnet units MG may be arranged to be substantially parallel to the second direction DR2.

Figure 6D:
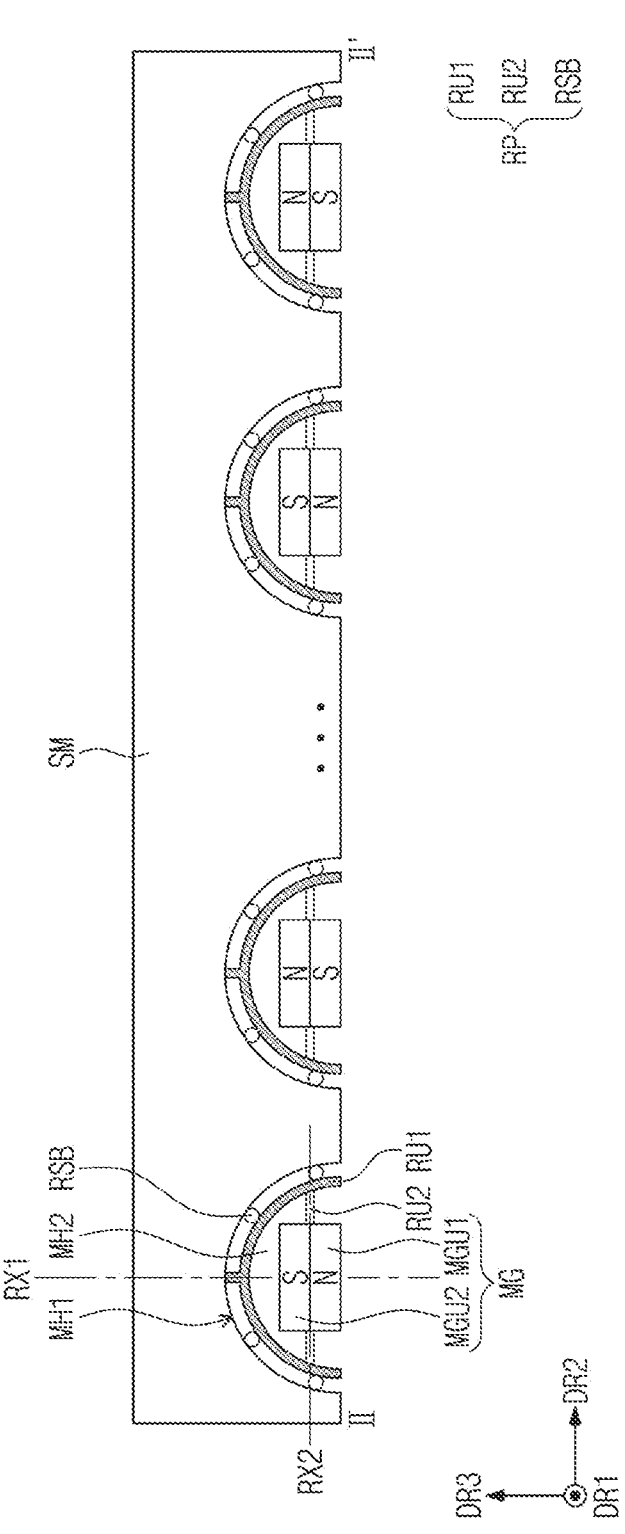
Figure 6E:
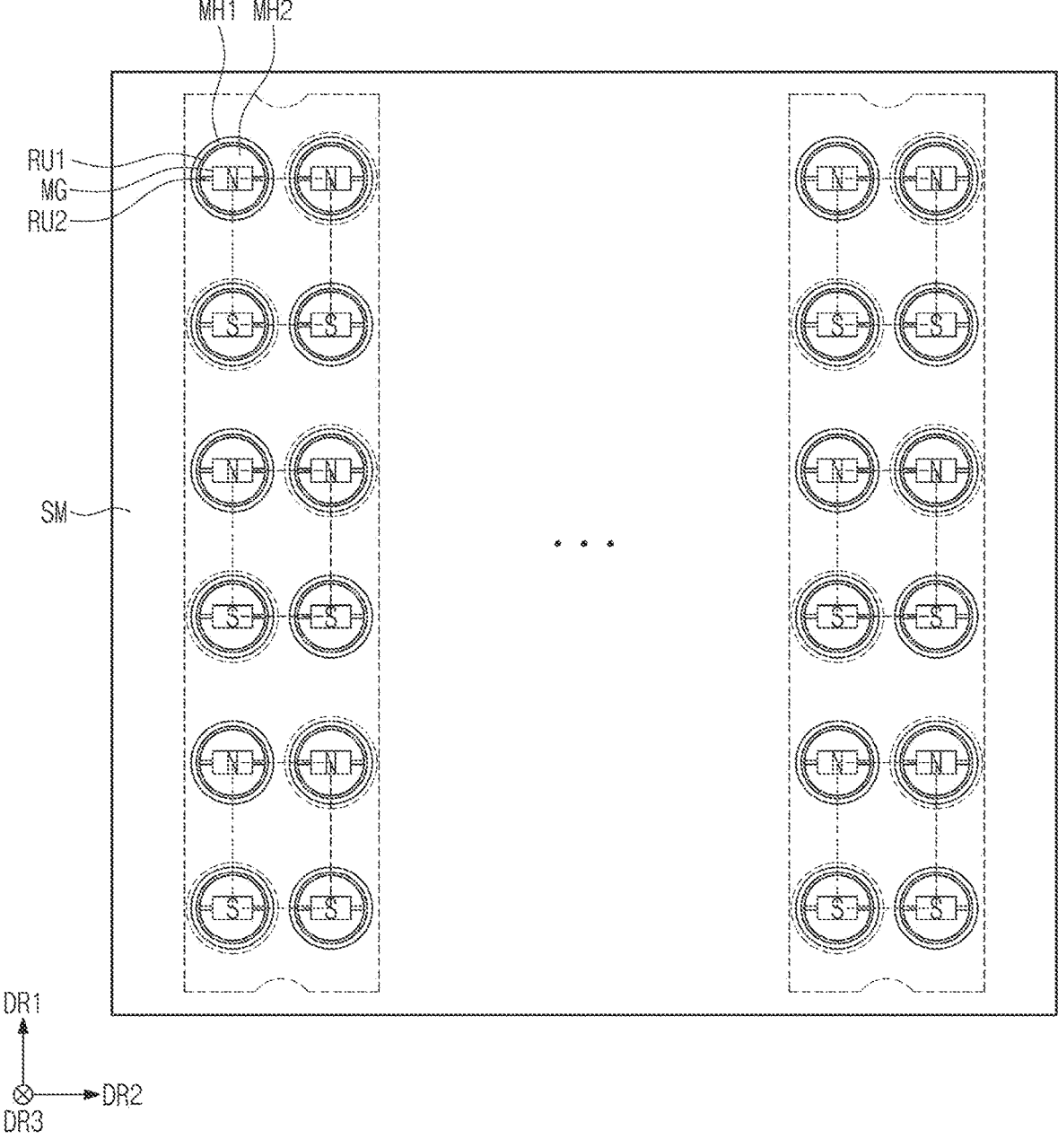

Referring to FIGS. 5, 6C, and 6D, a first rotating unit RU1 may rotate about the first rotational axis RX1 by 90 degrees after the cooling plate CP of FIG. 5 is located adjacent to the substrate SUB. For example, the first rotating unit RU1 may rotate in the counterclockwise direction.

When the first rotating unit RU1 rotates, the second rotating units RU2 and the magnet units MG connected to the first rotating unit RU1 may be rotated about the first rotational axis RX1 by 90 degrees. When the second rotating units RU2 and the magnet units MG are rotated about the first rotational axis RX1 by 90 degrees, the short sides of the magnet units MG may be arranged to be substantially parallel to the first direction DR1 as illustrated in FIGS. 6C and 6D. The long sides of the rotated magnet units MG may be arranged to be substantially parallel to the second direction DR2.

The magnet units MG located in odd-numbered columns may be located such that the first magnet units MGU1 face the second masks MM2. The magnet units MG located in even-numbered columns may be located such that the second magnet units MGU2 face the second masks MM2. Accordingly, the first magnet units MGU1 and the second magnet units MGU2 may be arranged to have the same respective polarity in the extension direction of the second masks MM2. That is, the arrangement direction of the polarities of the magnet units MG may be substantially parallel to the extension direction of the second masks MM2.

Figure 6F:
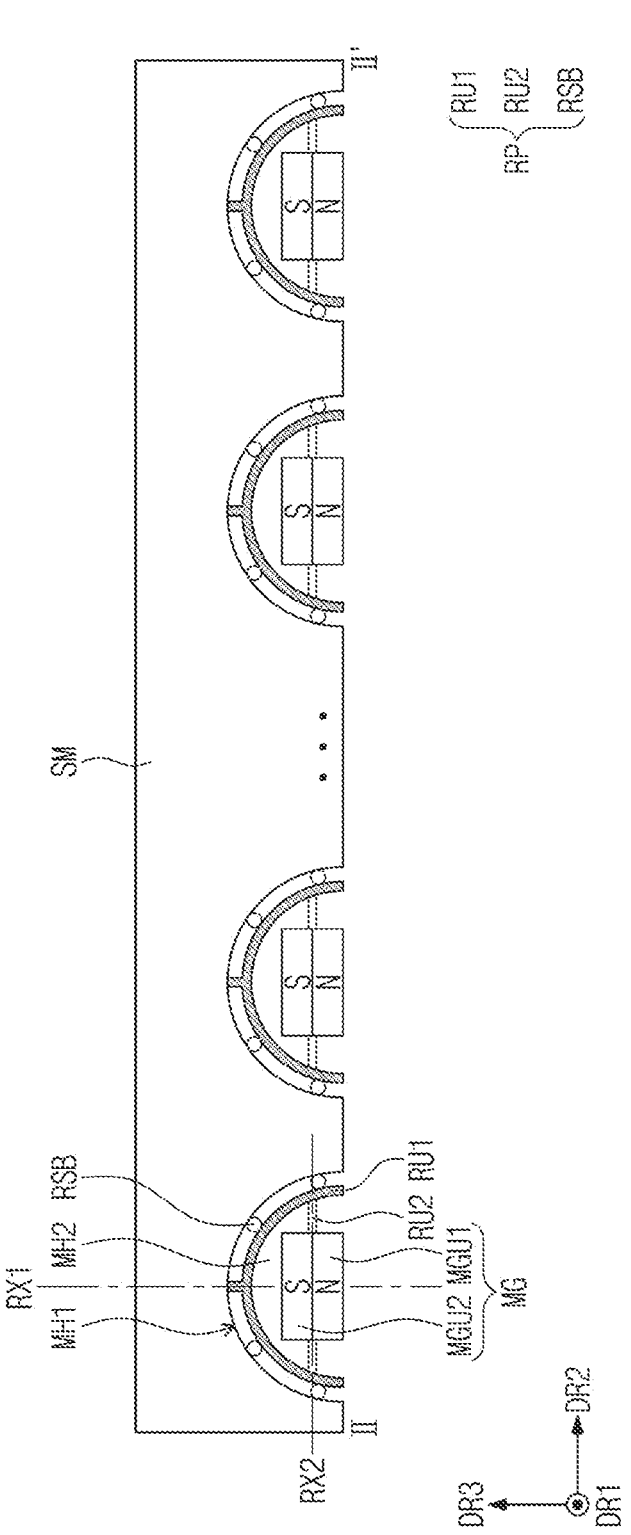

Referring to FIGS. 4G, 6A, and 6F, the first and second magnet units MGU1 and MGU2 facing the second masks MM2 may rotate about the second rotational axis RX2. The magnet units MG may be rotated by the second rotating units RU2 such that the arrangement direction of the polarities of the magnet units MG and the extension direction of the second masks MM2 cross each other. For example, the magnet units MG may be rotated about the second rotational axis RX2 in the clockwise direction.

Some of the magnet units MG may be rotated about the second rotational axis RX2 by the second rotating units RU2. For example, among the magnet units MG located in odd-numbered rows, the magnet units MG located in the even-numbered columns may be rotated about the second rotational axis RX2 by 180 degrees by the second rotating units RU2. Among the magnet units MG located in even-numbered rows, the magnet units MG located in the odd-numbered columns may be rotated about the second rotational axis RX2 by 180 degrees by the second rotating units RU2. For example, the magnet units MG illustrated by the dotted circles/circles comprising dashed line segments may be the magnet units MG that are rotated about the second rotational axis RX2. The rows may correspond to the second direction DR2, and the columns may correspond to the first direction DR1.

According to the operation, the arrangement direction of the respective polarities of the magnet units MG facing the second masks MM2 may cross the extension direction of the second masks MM2. For example, the magnet units MG located in the odd-numbered rows to face the second masks MM2 may be located such that the first magnet units MGU1 face the second masks MM2. The magnet units MG located in the even-numbered rows to face the second masks MM2 may be located such that the second magnet units MGU2 face the second masks MM2. That is, the first magnet units MGU1 may be arranged in a direction that is substantially parallel to the second direction DR2. The second magnet units MGU2 may be spaced apart from the first magnet units MGU1 in the first direction DR1, and may be arranged in a direction that is substantially parallel to the second direction DR2.

It has been described that the magnet units MG are rotated about the first rotational axis RX1 and then rotated about the second rotational axis RX2. However, without being limited thereto, the magnet units MG may be rotated about the second rotational axis RX2 and then rotated about the first rotational axis RX1, or may be concurrently or substantially simultaneously rotated about the first rotational axis RX1 and the second rotational axis RX2.

The second cell regions CEA2 of the second masks MM2 may overlap the magnet units MG. The periphery of each of the second cell regions CEA2 may overlap central portions of some of the first and second magnet units MGU1 and MGU2.

Figure 6G:
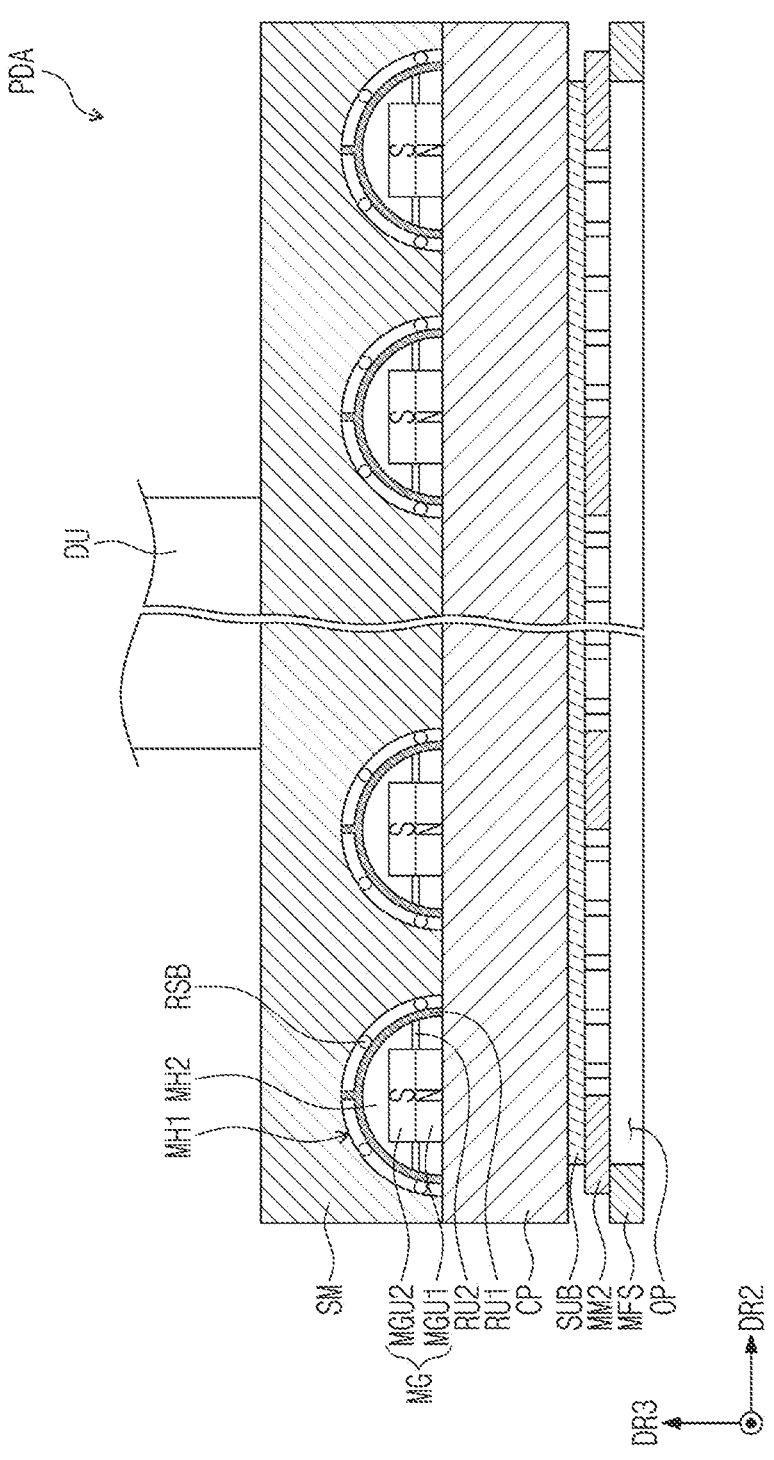

Referring to FIG. 6G, the magnet plate SM may be moved in the third direction DR3, and may be adjacent to the substrate SUB and the second masks MM2.

When the magnet plate SM is adjacent to the substrate SUB and the second masks MM2, an attractive force may be generated between the magnet units MG and the second masks MM2. Accordingly, the central portions of the second masks MM2 may be moved toward the magnet units MG. The substrate SUB located between the second masks MM2 and the magnet units MG may be brought into contact with the lower surface of the cooling plate CP by the second masks MM2. That is, the second masks MM2 and the substrate SUB may be spread substantially flat without sagging downward. Thereafter, a deposition process may be performed. The deposition process will be described below with reference to FIG. 14.

Figure 7A:
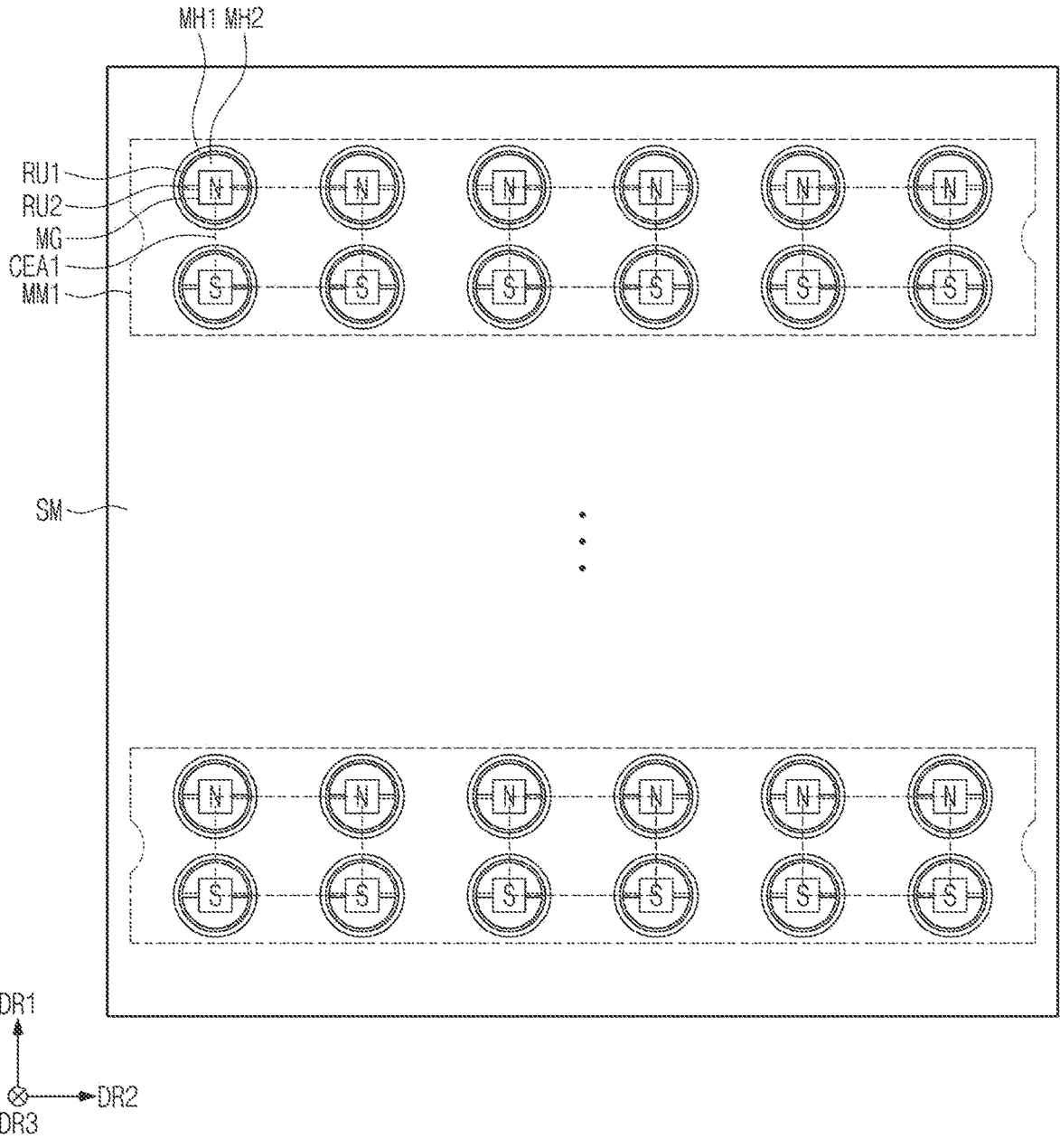
FIGS. 7A to 7C are bottom plan views of magnet units and a magnet plate according to one or more embodiments of the present disclosure when viewed in the third direction.
Figure 7B:
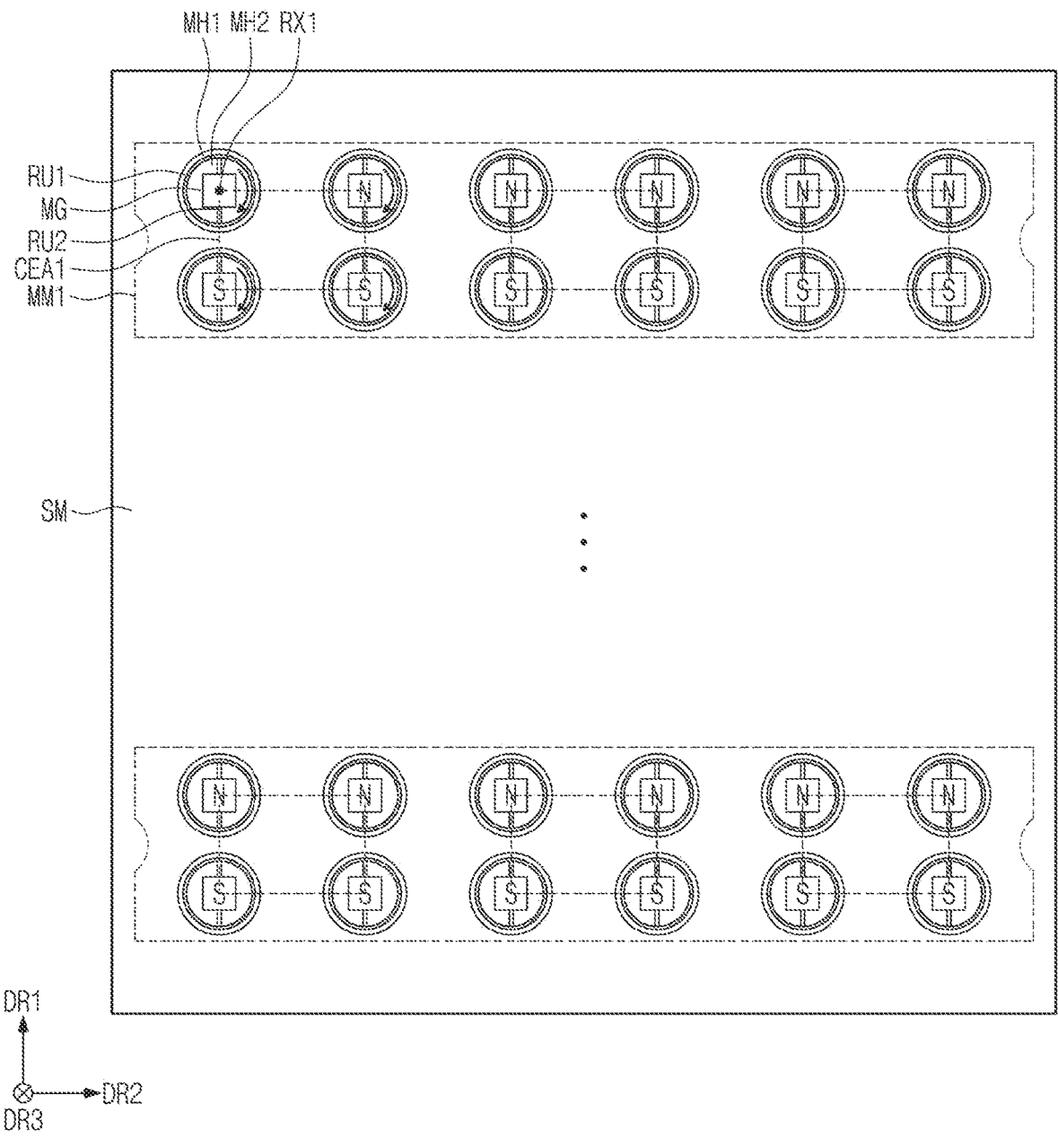
Figure 7C:
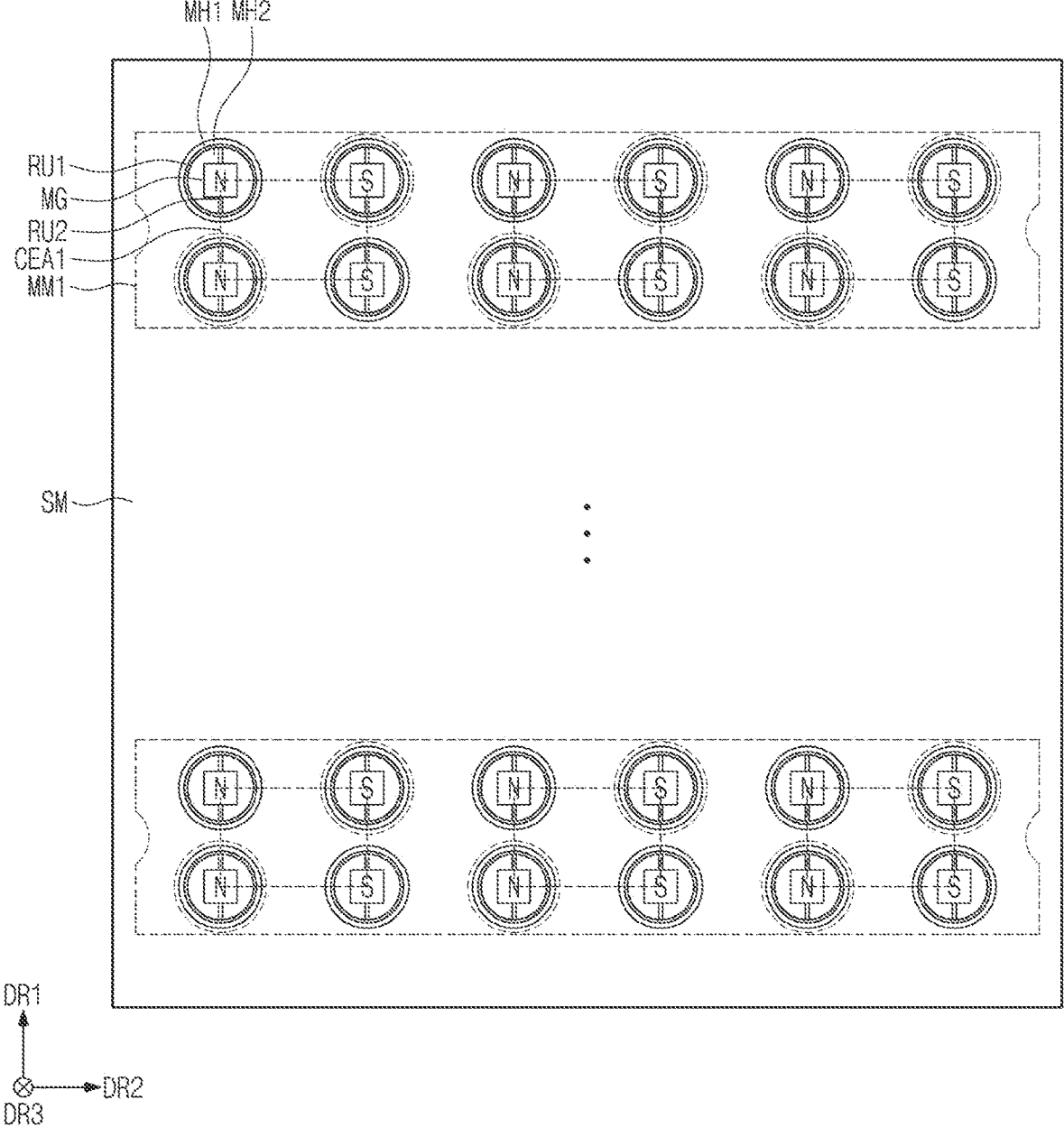

FIGS. 7A to 7C are bottom plan views of magnet units and a magnet plate according to one or more embodiments of the present disclosure when viewed in the third direction.

FIGS. 7A to 7C illustrate one example in which first masks MM1 are located on a lower surface of the magnet plate SM. A rotating part RP, the magnet plate SM, and masks MM of FIGS. 7A to 7C are respectively identical to the rotating part RP, the magnet plate SM, and the masks MM of FIGS. 1 to 6F, and therefore will be omitted from the description below or will be briefly described.

Referring to FIGS. 4C and 7A to 7C, FIG. 7A illustrates the magnet plate SM in which the magnet units MG of the present disclosure, which have a different shape when viewed in the plane than those previously described, are located. For example, the shape of the magnet units MG as viewed in the plane may be a square shape.

First magnet units MGU1 may be arranged in the second direction DR2. Second magnet units MGU2 may be arranged in the second direction DR2. The first magnet units MGU1 and the second magnet units MGU2 may be arranged to have the same respective polarity in the extension direction of the first masks MM1. That is, the arrangement direction of respective polarities of the magnet units MG may be substantially parallel to the extension direction of the first masks MM1.

Referring to FIGS. 7B and 4C, when a cooling plate CP is moved in the third direction DR3 and is located adjacent to a substrate SUB as illustrated in FIG. 4C, a first rotating unit RU1 may rotate about the first rotational axis RX1. For example, the first rotating units RU1 may rotate in the clockwise direction.

As the first rotating unit RU1 rotates, the magnet units MG and second rotating units RU2 connected to the first rotating unit RU1 may be rotated about the first rotational axis RX1. The second rotating units RU2 may be arranged to be substantially parallel to the first direction DR1.

Referring to FIG. 7C, the first and second magnet units MGU1 and MGU2 facing the first masks MM1 may be able to be rotated about the second rotational axis RX2. The magnet units MG may be rotated by the second rotating units RU2 such that the arrangement direction of the respective polarities of the magnet units MG and the extension direction of second masks MM2 cross each other. For example, the magnet units MG may be rotated about the second rotational axis RX2 in the clockwise direction.

Some of the magnet units MG may be rotated about the second rotational axis RX2 by the second rotating units RU2. For example, the magnet units MG located in even-numbered columns among the magnet units MG located in odd-numbered rows, and the magnet units MG located in odd-numbered columns among the magnet units MG located in even-numbered rows, may be rotated about the second rotational axis RX2 by 180 degrees by the second rotating units RU2.

According to the operation, the arrangement direction of the polarities of the magnet units MG facing the first masks MM1 may cross the extension direction of the first masks MM1. That is, the first magnet units MGU1 and the second magnet units MGU2 may be respectively arranged in a direction that is substantially parallel to the first direction DR1.

First cell regions CEA1 of the first masks MM1 may overlap the magnet units MG. The periphery of each of the first cell regions CEA1 may overlap central portions of some of the first and second magnet units MGU1 and MGU2.

Also, when the second masks MM2 are located in a lower portion of the magnet plate SM, the magnet units MG may be rotated about the first rotational axis RX1 and the second rotational axis RX2, and the polarities of the magnet units MG may be arranged to cross the extension direction of the second masks MM2. Therefore, detailed description thereabout will be omitted.

Figure 8A:
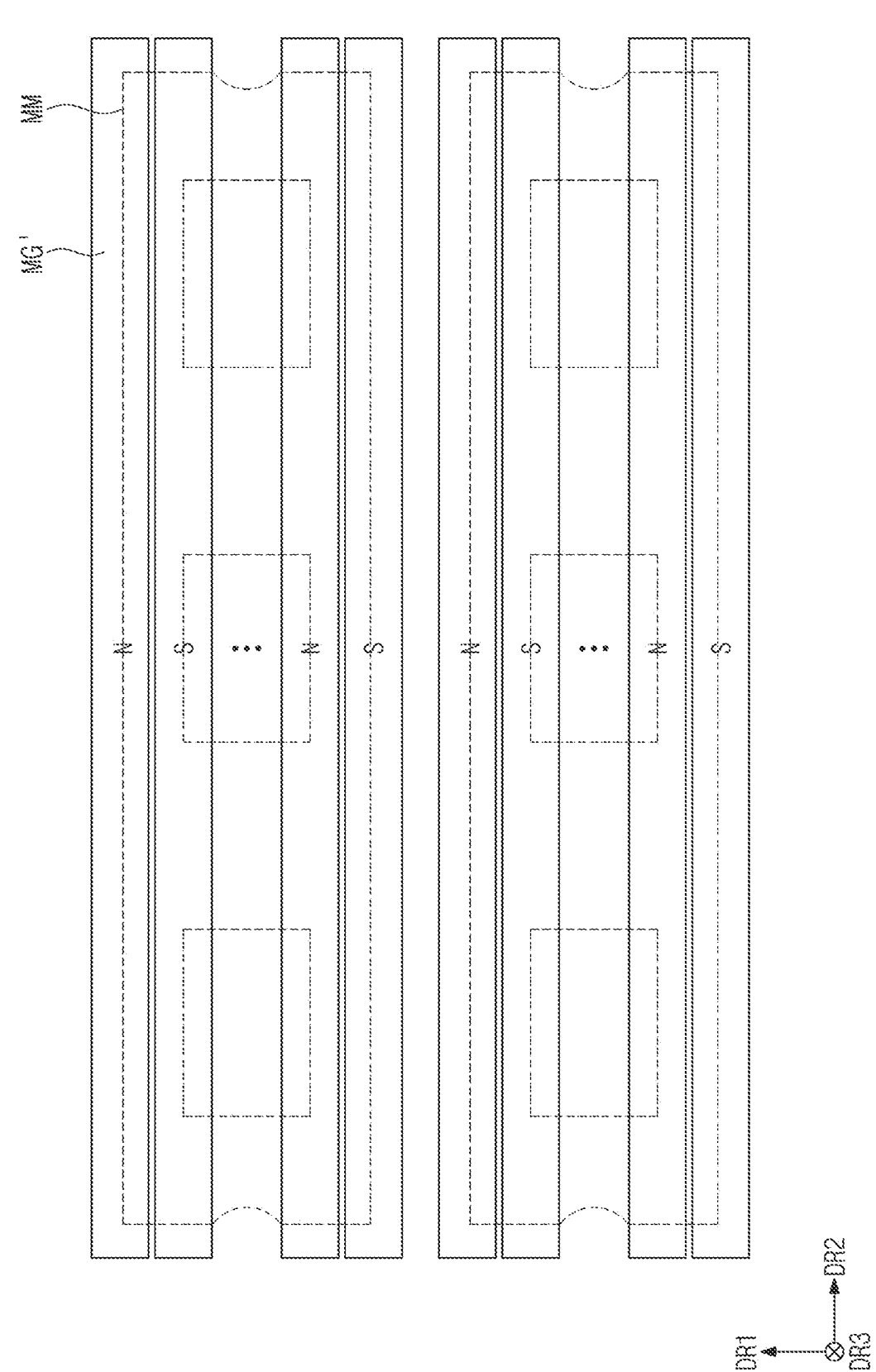
FIG. 8A is a view illustrating a state in which the direction of polarities of magnet units and an extension direction of masks are the same.
Figure 8B:
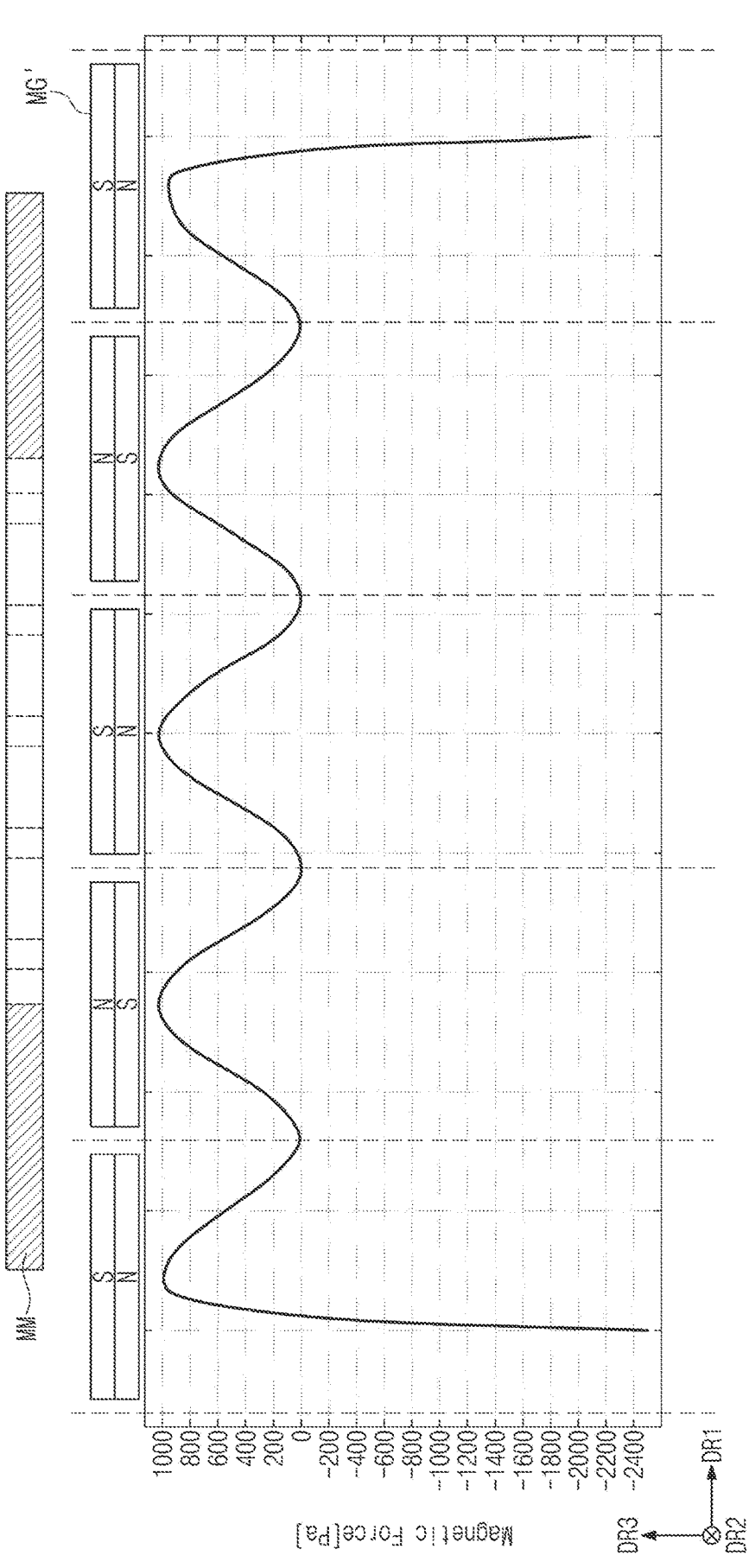
FIG. 8B is a view illustrating a magnetic force between the magnet units and the masks in the state in which the direction of the polarities of the magnet units and the extension direction of the masks are the same.

FIG. 8A is a view illustrating a state in which the direction of respective polarities of magnet units and an extension direction of masks are the same. FIG. 8B is a view illustrating a magnetic force between the magnet units MG' and the masks MM in the state in which the direction of the respective polarities of the magnet units MG' and the extension direction of the masks MM are the same, the magnet units MG' and the masks being viewed in the second direction DR2.

For example, the mask MM illustrated in FIG. 8B is located on five magnet units MG'. However, without being limited thereto, the mask MM may have various sizes, and the number of magnet units MG' is also not particularly limited.

Referring to FIGS. 8A and 8B, the magnet units MG' may be arranged in the first direction DR1 and may extend in the second direction DR2. For example, the masks MM may be arranged in the first direction DR1 and may extend in the second direction DR2. Long sides of the magnet units MG' may be substantially parallel to the second direction DR2. The direction of the polarities of the magnet units MG' may be substantially parallel to the extension direction of the masks MM.

Unlike in FIG. 4H, a deposition process may be performed using the magnet units MG' and the masks MM of FIG. 8A. In this case, as in the graph illustrated in FIG. 8B, a repulsive force (e.g. a state in which a magnetic force is negative) may be generated between ends of the magnet units MG' and the masks MM. When the repulsive force is generated, the masks MM may not be normally attracted flat to the substrate SUB of FIGS. 4H and 6G, and defects may occur during the deposition process.

Figure 9:
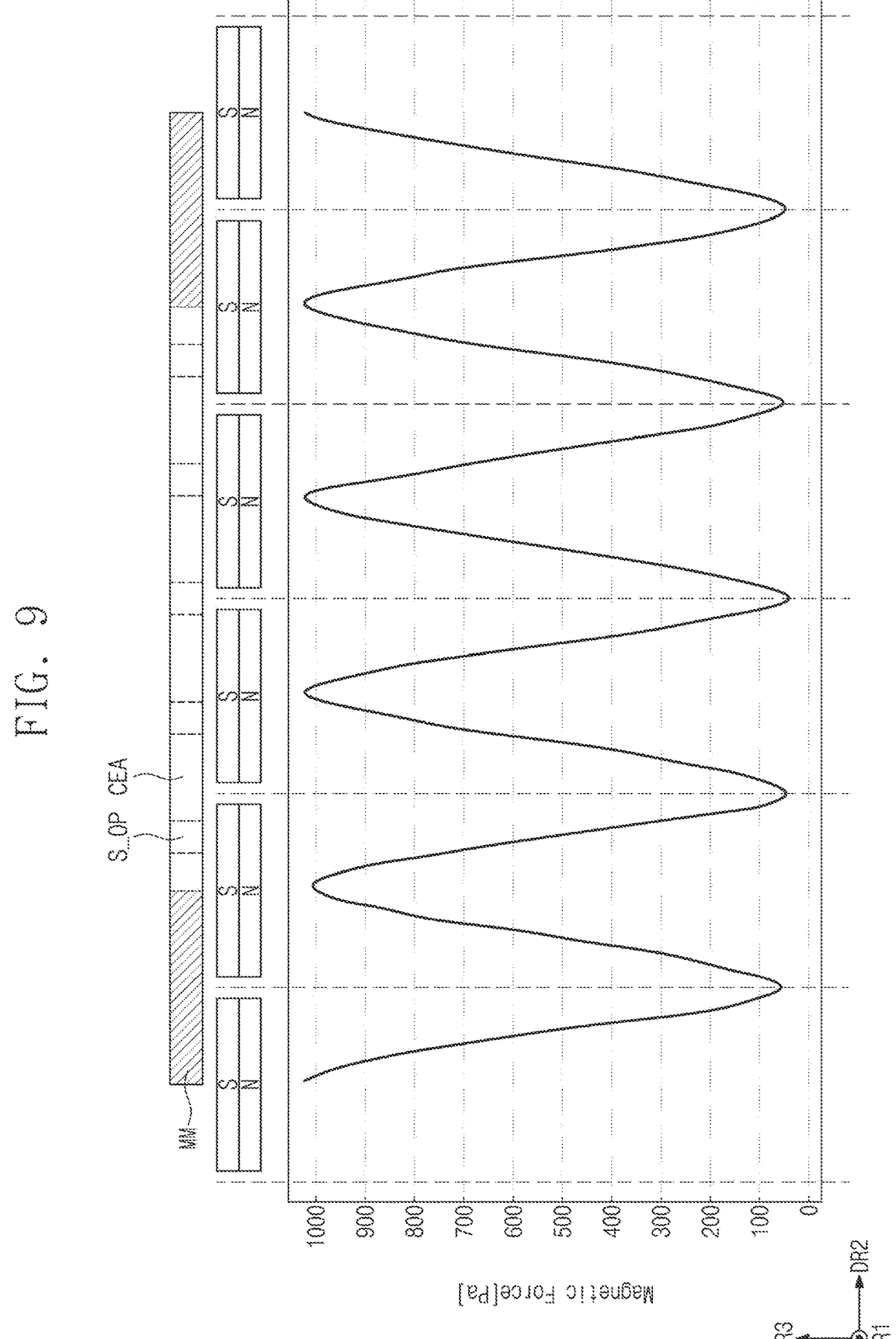
FIG. 9 is a view illustrating a magnetic force between magnet units and masks in a state in which an arrangement direction of polarities of the magnet units and an extension direction of the masks cross each other, according to one or more embodiments of the present disclosure.

FIG. 9 is a view illustrating a magnetic force between magnet units and masks in a state in which an arrangement direction of polarities of the magnet units and an extension direction of the masks cross each other.

Referring to FIG. 9, in one or more embodiments of the present disclosure, the magnet units MG may be rotated by a rotating part RP depending on the extension direction of the masks MM. The arrangement direction of the polarities of the magnet units MG facing the masks MM may cross the extension direction of the masks MM by the rotating part RP. In this case, as in the graph illustrated in FIG. 9, a repulsive force may not be generated between the magnet units MG and the masks MM. Because an attractive force, rather than a repulsive force, is generated between the magnet units MG and the masks MM depending on a magnetic force, the substrate SUB and the masks MM may be spread flat during a deposition process. Accordingly, the deposition process may be normally performed, and thus, a defect rate may be reduced.

Figure 10A:
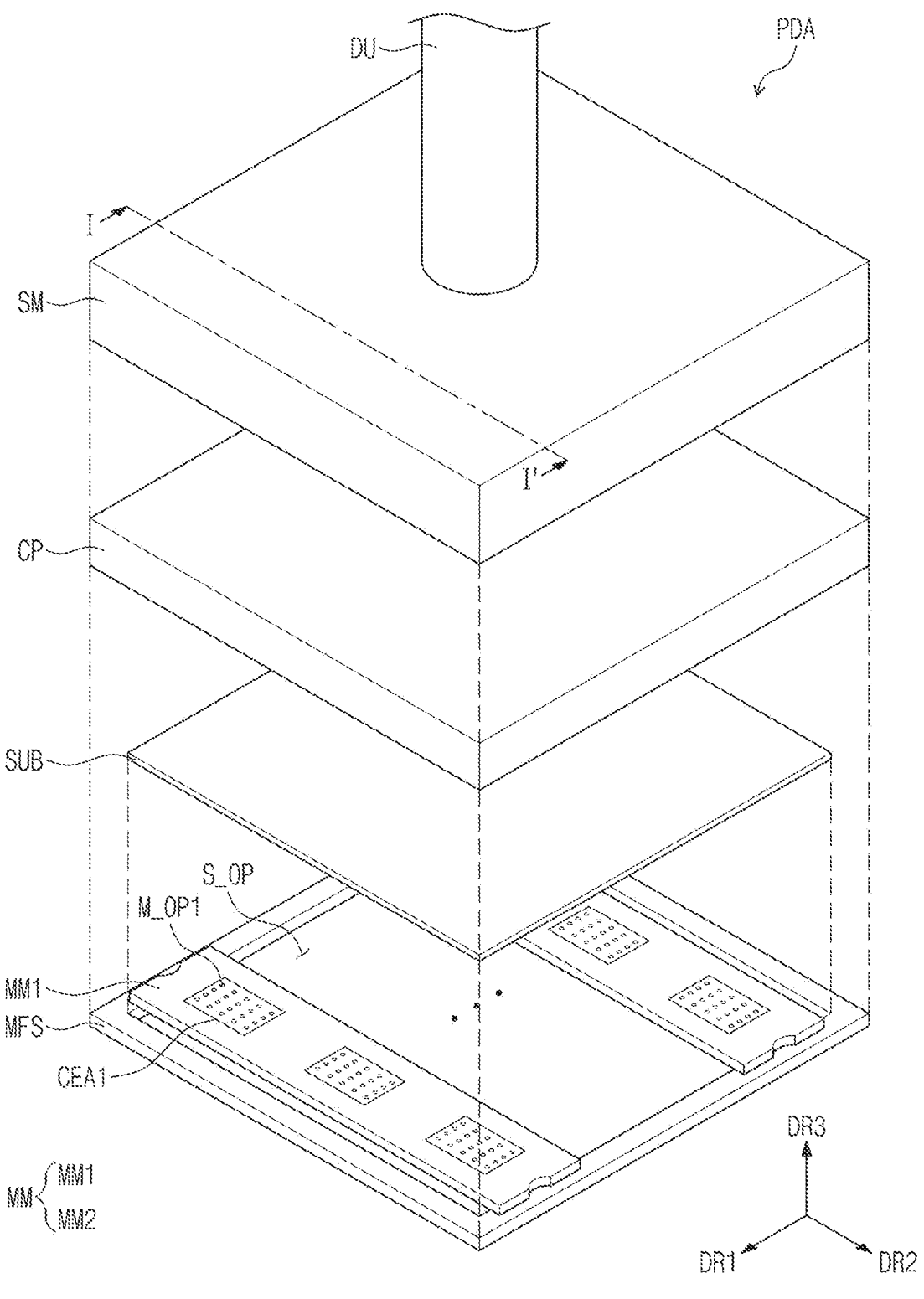
FIGS. 10A to 10C are views for describing a deposition method of a substrate using a deposition apparatus according to one or more embodiments.
Figure 10B:
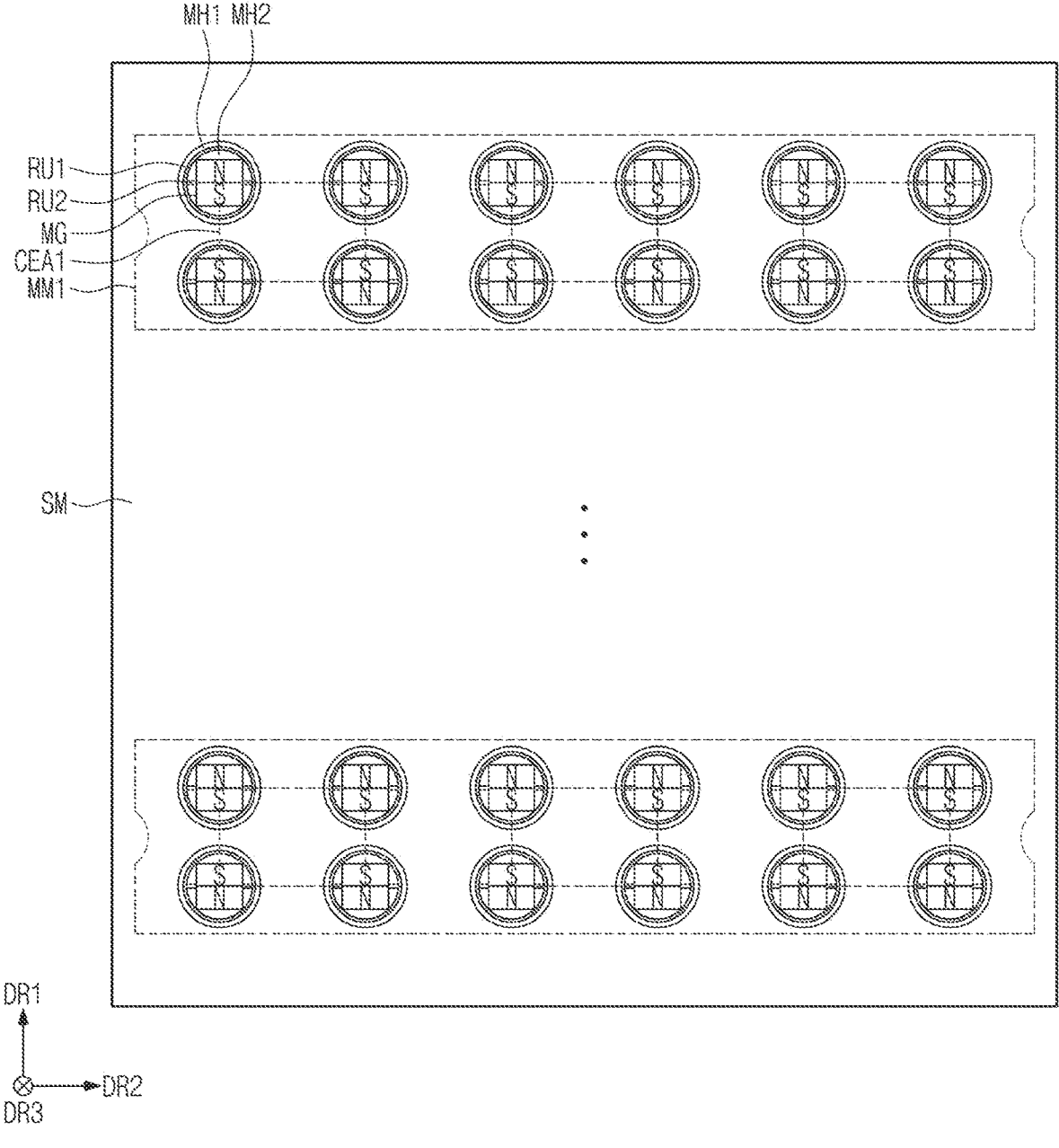
Figure 10C:
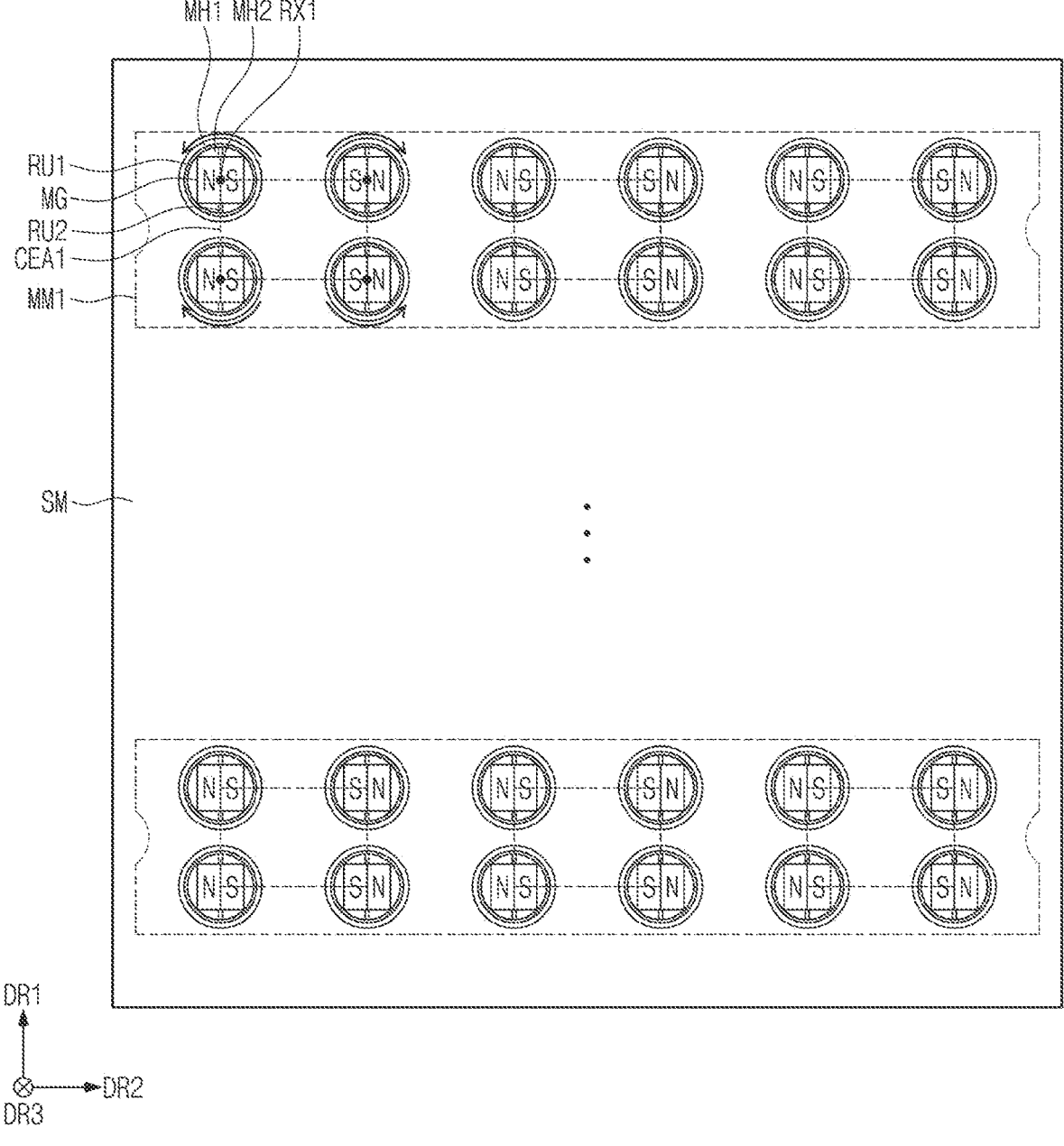

FIGS. 10A to 10C are views for describing a deposition method of a substrate using a deposition apparatus according to one or more embodiments.

For example, FIG. 10A is a perspective view of the deposition apparatus PDA in which first masks MM1 are located on a mask frame MFS. FIGS. 10B and 10C are bottom plan views of a magnet plate SM and magnet units MG of the deposition apparatus according to one or more embodiments of the present disclosure as viewed in the third direction.

The mask frame MFS, the first masks MM1, a cooling plate CP, the magnet plate SM, and a rotating part RP of FIGS. 10A to 10C are respectively identical to the mask frame MFS, the first masks MM1, the cooling plate CP, the magnet plate SM, and the rotating part RP of FIGS. 1 to 4H, and therefore will be omitted from the description below or will be briefly described.

Referring to FIG. 10A, the first masks MM1 may be arranged in the first direction DR1, may extend in the second direction DR2, and may be located on the mask frame MFS. A substrate SUB may be located between the cooling plate CP and the first masks MM1, and the magnet plate SM and the magnet units MG described in FIG. 10B may be located on the cooling plate CP.

Referring to FIGS. 4C and 10B, first magnet units MGU1 and second magnet units MGU2 may contact each other in the first direction DR1. Each of the second magnet units MGU2 may be respectively connected to one of surfaces of a corresponding first magnet unit MGU1 to face each other in the first direction DR1.

The first magnet units MGU1 and the second magnet units MGU2 may be located to face the first masks MM1. The periphery of each of first cell regions CEA1 may overlap central portions of some of the first and second magnet units MGU1 and MGU2.

Before the cooling plate CP is located adjacent to the substrate SUB, the arrangement direction of polarities of the magnet units MG may be substantially parallel to the extension direction of the first masks MM1.

The extension direction of second rotating units RU2 may be substantially parallel to the extension direction of the first masks MM1. The extension direction of the second rotating units RU2 may be substantially parallel to the arrangement direction of the polarities of the magnet units MG.

Referring to FIGS. 4C and 10C, the magnet units MG may be rotated by the rotating part RP when the cooling plate CP is located adjacent to the substrate SUB. The magnet units MG may be rotated about the first rotational axis RX1 by a first rotating unit RU1. For example, in FIG. 10C, the first rotational axis RX1 is illustrated only in four magnet units MG. However, all of the magnet units MG located on the lower surface of the magnet plate SM may be rotated about the first rotational axis RX1.

Magnet units MG and adjacent magnet units MG may be rotated by 90 degrees in different directions. The h$^{th}$ pair of first and second magnet units MGU1 and MGU2 and the (h+1)$^{th}$ pair of first and second magnet units MGU1 and MGU2 in the first direction DR1 or the second direction DR2 may be rotated in different directions ("h" is a natural number). For example, the first magnet units MG in the first direction DR1 or the second direction DR2 may be rotated in the counterclockwise direction, and the magnet units MG adjacent to the first magnet units MG in the first direction DR1 and the second direction DR2 may be rotated in the clockwise direction.

When the magnet units MG are rotated by the first rotating unit RU1, the h$^{th}$ magnet units MG and the (h+1)$^{th}$ magnet units MG in the second direction DR2 may be located such that the same polarities face each other. For example, the first magnet units MGU1 of the first magnet units MG may be located on the left side based on the first direction DR1, and the second magnet units MGU2 may be located on the right side. The second magnet units MGU2 of the second magnet units MG may be located on the left side based on the first direction DR1, and the first magnet units MGU1 may be located on the right side.

The polarities of the magnet units MG may be arranged to cross the extension direction of the first masks MM1. The polarities of the magnet units MG may be arranged in a direction that is substantially parallel to the first direction DR1.

The lower surfaces of the magnet units MG may have, for example, a square shape, the sides of which have a length of about 10 mm. The distance between one side of the $h^{th}$ magnet unit and one side of the $(h+1)^{th}$ magnet unit may be about 14.2 mm. In the case in which the sides of the lower surfaces of the magnet units MG have a length of about 10 mm and the distance between one side of the $h^{th}$ magnet unit and one side of the $(h+1)^{th}$ magnet unit is about 14.2 mm, the magnet units MG may be rotated about the second rotational axis RX2 without interference with the adjacent magnet units MG.

The first cell regions CEA1 of the first masks MM1 may overlap the magnet units MG. The periphery of each of the first cell regions CEA1 may overlap the central portions of some of the first and second magnet units MGU1 and MGU2.

Figure 11A:
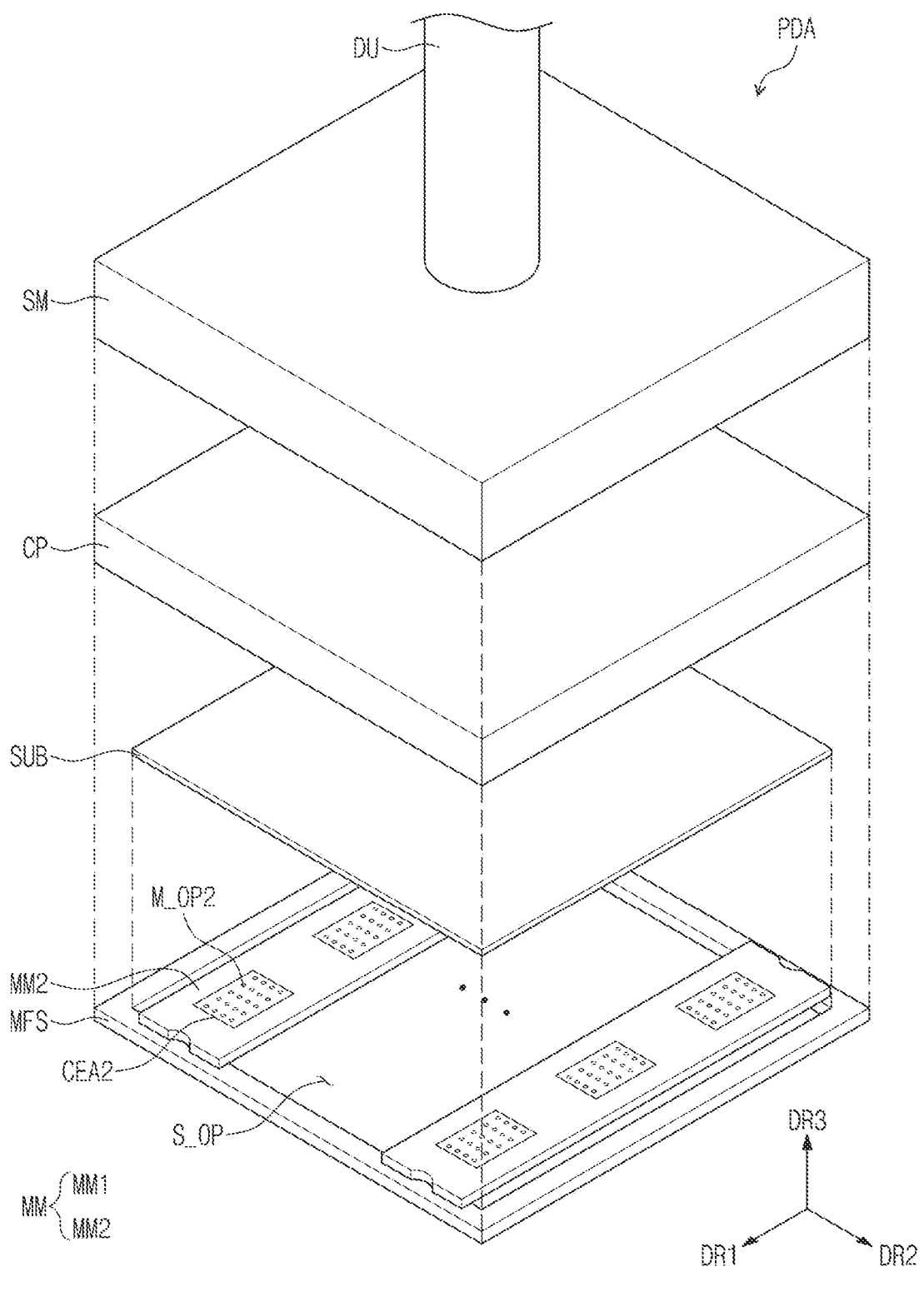
FIGS. 11A to 11C are views for describing a deposition method of a substrate using a deposition apparatus according to one or more embodiments.
Figure 11B:
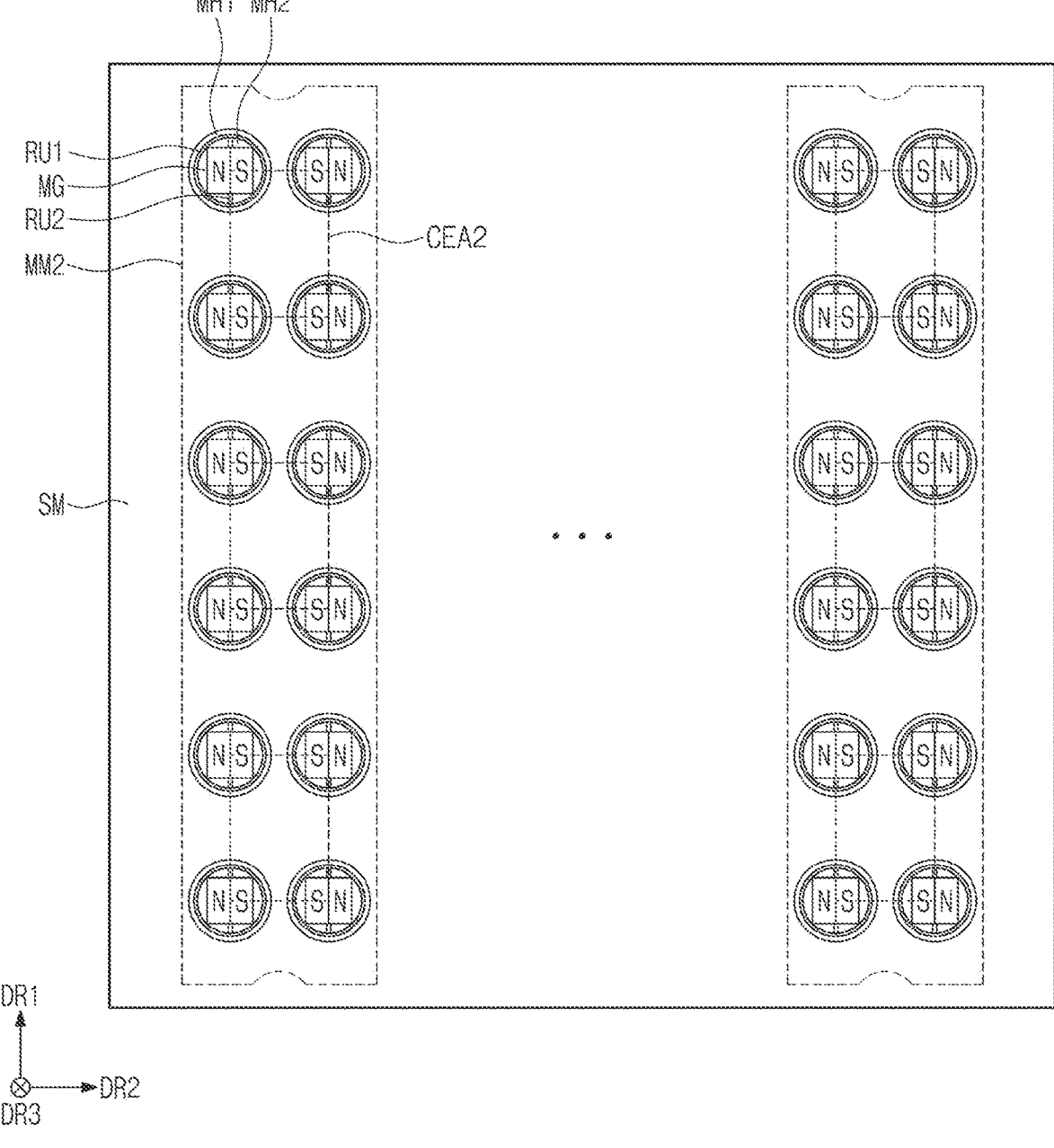
Figure 11C:
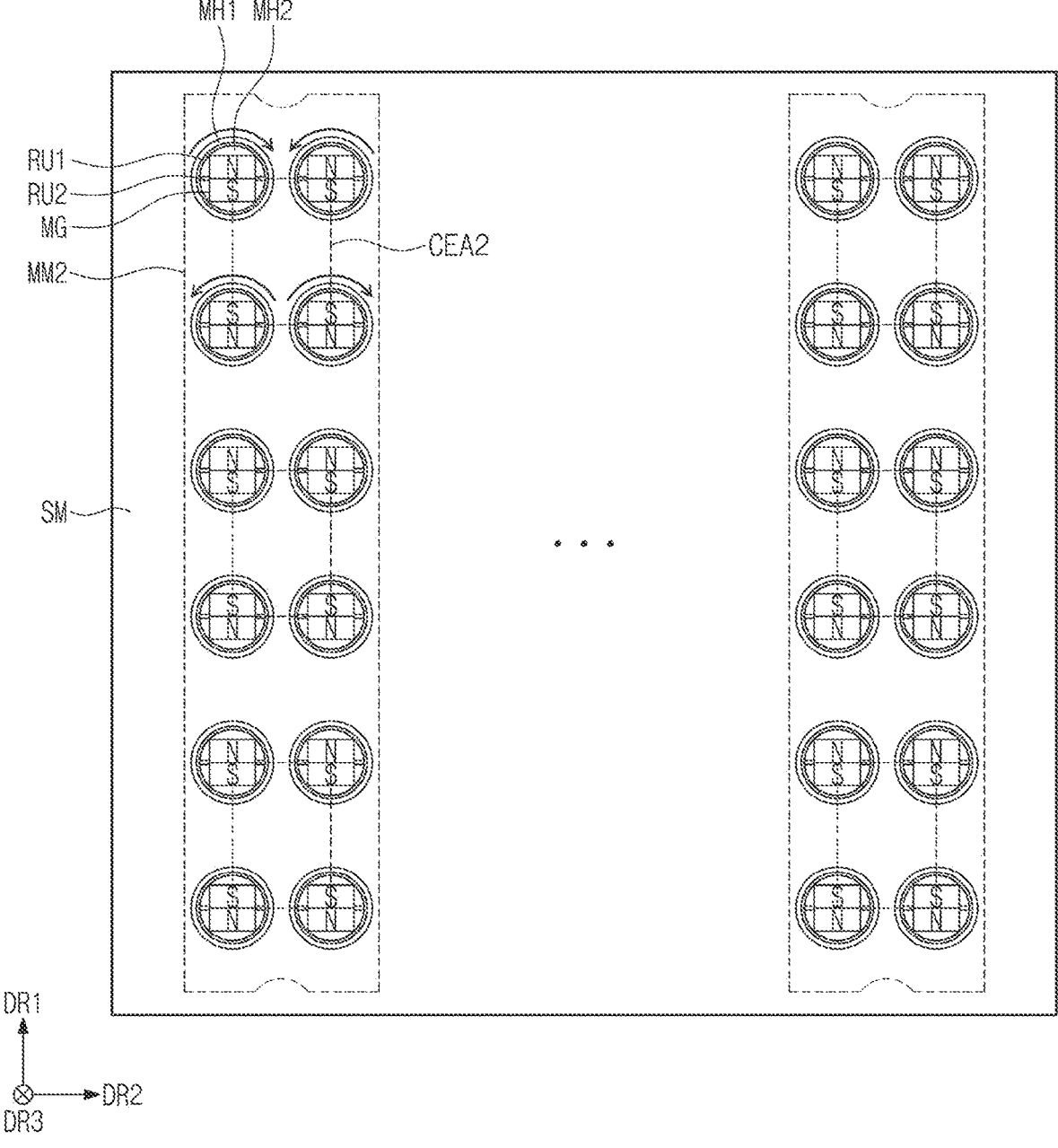

FIGS. 11A to 11C are views for describing a deposition method of a substrate using a deposition apparatus according to one or more embodiments.

For example, a case in which second masks MM2 are located on a mask frame MFS is illustrated. FIG. 11A is a perspective view of the deposition apparatus according to one or more embodiments. FIGS. 11B and 11C are bottom plan views of a magnet plate SM and magnet units MG of the deposition apparatus according to one or more embodiments as viewed in the third direction DR3.

The mask frame MFS, the second masks MM2, a cooling plate CP, the magnet plate SM, and a rotating part RP of FIGS. 11A to 11C are respectively identical to the mask frame MFS, the second masks MM2, the cooling plate CP, the magnet plate SM, and the rotating part RP of FIGS. 1 to 3, and therefore will be omitted from the description below or will be briefly described.

The magnet units MG of FIGS. 11A to 11C are identical to the magnet units MG of FIGS. 10A to 10C, and therefore will be omitted from the description below or will be briefly described.

Referring to FIG. 11A, the second masks MM2 may extend in the first direction DR1, may be arranged in the second direction DR2, and may be located on the mask frame MFS. A substrate SUB may be located between the cooling plate CP and the second masks MM2, and the magnet plate SM and the magnet units MG may be located on the cooling plate CP.

Referring to FIGS. 4C and 11B, before the cooling plate CP is located adjacent to the substrate SUB, polarities of the magnet units MG may be arranged to be substantially parallel to the first direction DR1. First magnet units MGU1 may be arranged in the first direction DR1. Second magnet units MGU2 may be arranged in the first direction DR1. The arrangement direction of the polarities may be substantially parallel to the extension direction of the second masks MM2.

The extension direction of second rotating units RU2 may be substantially parallel to the extension direction of the second masks MM2. The extension direction of the second rotating units RU2 may be substantially parallel to the arrangement direction of the polarities of the magnet units MG.

Referring to FIGS. 4C and 11C, the magnet units MG may be rotated by the rotating part RP when the cooling plate CP is brought into contact with the substrate SUB. The magnet units MG may be rotated about the first rotational axis RX1 by a first rotating unit RU1.

Magnet units MG and adjacent magnet units MG (e.g., respective pairs of magnet units MG) may be rotated by 90 degrees in different directions. The $h^{th}$ pair of first and second magnet units MGU1 and MGU2 and the $(h+1)^{th}$ pair of first and second magnet units MGU1 and MGU2 in the first direction DR1 or the second direction DR2 may be rotated in different directions. For example, the first magnet units MG in the first direction DR1 or the second direction DR2 may be rotated in the clockwise direction, and the magnet units MG adjacent to the first magnet units MG in the first direction DR1 and the second direction DR2 may be rotated in the counterclockwise direction.

When the magnet units MG are rotated by the first rotating unit RU1, the $h^{th}$ magnet units MG and the $(h+1)^{th}$ magnet units MG in the first direction DR1 may be arranged such that the same respective polarities face each other. For example, the second magnet units MGU2 of the $h^{th}$ magnet units MG may be located below the first magnet units MGU1 based on the second direction DR2. The first magnet units MGU1 of the $(h+1)^{th}$ magnet units MG may be located below the second magnet units MGU2 based on the second direction DR2.

The polarities of the magnet units MG may be arranged to cross the extension direction of the second masks MM2. The polarities of the magnet units MG may be arranged in a direction that is substantially parallel to the second direction DR2.

As described with reference to FIG. 10C, the lower surfaces of the magnet units MG may have, for example, a square shape, the sides of which have a length of about 10 mm. The distance between one side of the $h^{th}$ magnet unit and one side of the $(h+1)^{th}$ magnet unit may be about 14.2 mm. Accordingly, the magnet units MG may be rotated about the second rotational axis RX2 without interference with the adjacent magnet units MG.

Second cell regions CEA2 of the second masks MM2 may overlap the magnet units MG. The periphery of each of the second cell regions CEA2 may overlap central portions of some of the first and second magnet units MGU1 and MGU2.

Referring to FIGS. 11A to 11C, the magnet units MG may be rotated by the rotating part RP depending on the arrangement direction and the extension direction of the masks MM. The arrangement direction of the polarities of the magnet units MG may cross the extension direction of the masks MM. That is, even when the extension direction of the masks MM is changed, the arrangement direction of the polarities may be changed by rotating the magnet units MG, and thus a repulsive force is not generated between the masks MM and the magnet units MG. Accordingly, the masks MM may be attracted to be substantially flat to the substrate SUB. As a result, a defect rate may be reduced when a deposition material is provided to the substrate SUB.

Figure 12:
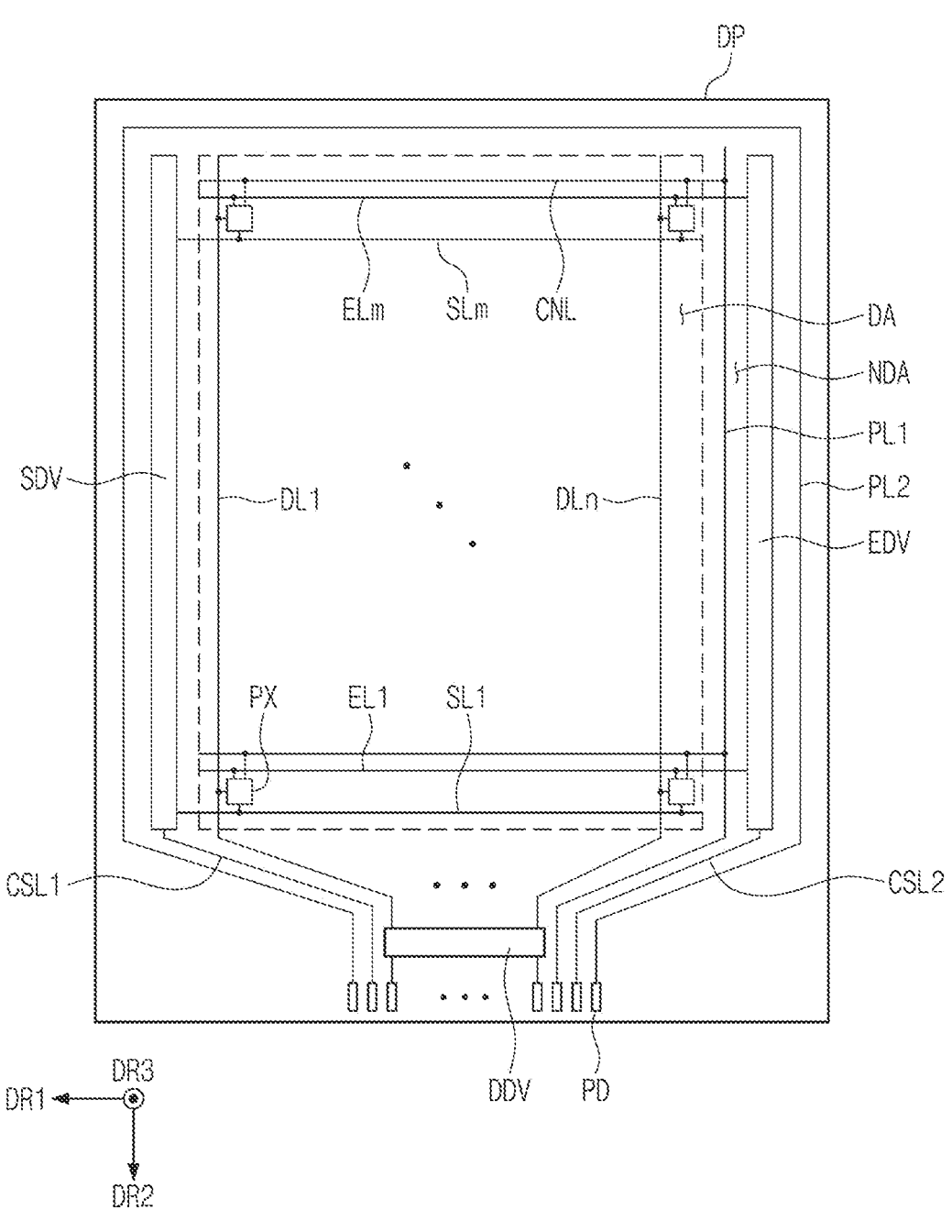
FIG. 12 is a plan view of a display panel manufactured using masks illustrated in FIGS. 1 and 5.

FIG. 12 is a plan view of a display panel manufactured using the masks illustrated in FIGS. 1 and 5.

Referring to FIG. 12, the display panel DP may have a rectangular shape having short sides extending in the first direction DR1, and long sides extending in the second direction DR2. However, the shape of the display panel DP is not limited thereto. The display panel DP may include a display part DA, and a non-display part NDA surrounding the display part DA.

The display panel DP may be an emissive display panel. The display panel DP may be an organic light-emitting display panel or a quantum-dot light-emitting display panel. An emissive layer of the organic light-emitting display panel may include an organic light-emitting material. An emissive layer of the quantum-dot light-emitting display panel may include quantum dots or quantum rods. Hereinafter, it will be exemplified that the display panel DP is an organic light-emitting display panel.

The display panel DP may include a plurality of pixels PX, a plurality of scan lines SL1 to SLm, a plurality of data lines DL1 to DLn, a plurality of light emission lines EL1 to ELm, first and second control lines CSL1 and CSL2, first and second power lines PL1 and PL2, connecting lines CNL, and a plurality of pads PD ("m" and "n" being natural numbers).

The pixels PX may be located in the display part DA. A scan driver SDV and a light emission driver EDV may be located in the non-display part NDA adjacent to the long sides of the display panel DP. The data driver DDV may be located in the non-display part NDA adjacent to one of the short sides of the display panel DP. When viewed on the plane, the data driver DDV may be adjacent to a lower end of the display panel DP.

The scan lines SL1 to SLm may extend in the first direction DR1, and may be connected to the pixels PX and the scan driver SDV. The data lines DL1 to DLn may extend in the second direction DR2 and may be connected to the pixels PX and the data driver DDV. The light emission lines EL1 to ELm may extend in the first direction DR1 and may be connected to the pixels PX and the light emission driver EDV.

The first power line PL1 may extend in the second direction DR2 and may be located in the non-display part NDA. The first power line PL1 may be located between the display part DA and the light emission driver EDV. However, without being limited thereto, the first power line PL1 may be located between the display part DA and the scan driver SDV.

The connecting lines CNL may extend in the first direction DR1 and may be arranged in the second direction DR2. The connecting lines CNL may be connected to the first power line PL1 and the pixels PX. A first voltage may be applied to the pixels PX through the first power line PL1 and the connecting lines CNL connected with each other.

The second power line PL2 may be located in the non-display part NDA. The second power line PL2 may extend along the long sides of the display panel DP and the other short side of the display panel DP where the data driver DDV is not located. The second power line PL2 may be located outward of the scan driver SDV and the light emission driver EDV.

In one or more embodiments, the second power line PL2 may extend toward the display part DA and may be connected to the pixels PX. A second voltage having a lower level than the first voltage may be applied to the pixels PX through the second power line PL2.

The first control line CSL1 may be connected to the scan driver SDV, and may extend toward the lower end of the display panel DP when viewed on the plane. The second control line CSL2 may be connected to the light emission driver EDV, and may extend toward the lower end of the display panel DP when viewed on the plane. The data driver DDV may be located between the first control line CSL1 and the second control line CSL2.

The pads PD may be located on the display panel DP. The pads PD may be closer to the lower end of the display panel DP than the data driver DDV. The data driver DDV, the first power line PL1, the second power line PL2, the first control line CSL1, and the second control line CSL2 may be connected to the pads PD. The data lines DL1 to DLn may be connected to the data driver DDV, and the data driver DDV may be connected to the pads PD corresponding to the data lines DL1 to DLn.

Each of the first and second cell regions CEA1 and CEA2 illustrated in FIGS. 1 and 5 may correspond to the display panel DP illustrated in FIG. 12. Light-emitting elements of one display panel DP may be formed by one first or second cell region CEA1 or CEA2.

Unit regions corresponding to display panels DP may be defined on the above-described substrate SUB. After the light-emitting elements are formed in the unit regions, the unit regions may be cut. Accordingly, the display panel DP illustrated in FIG. 12 may be manufactured.

In one or more embodiments, a timing controller for controlling operations of the scan driver SDV, the data driver DDV, and the light emission driver EDV, and a voltage generator for generating the first and second voltages may be located on a printed circuit board. The timing controller and the voltage generator may be connected to the corresponding pads PD through the printed circuit board.

The scan driver SDV may generate a plurality of scan signals, and the scan signals may be applied to the pixels PX through the scan lines SL1 to SLm. The data driver DDV may generate a plurality of data voltages, and the data voltages may be applied to the pixels PX through the data lines DL1 to DLn. The light emission driver EDV may generate a plurality of light emission signals, and the light emission signals may be applied to the pixels PX through the light emission lines EL1 to ELm.

The pixels PX may receive the data voltages in response to the scan signals. The pixels PX may display an image by emitting light having luminance corresponding to the data voltages in response to the light emission signals. Light emission time of the pixels PX may be controlled by the light emission signals.

The above-described lines may include the data lines DL1 to DLn. Pads connected to the above-described lines may include the pads PD illustrated in FIG. 12. The display panel DP in which emissive layers of the pixels PX are not formed may be defined as the substrate SUB described above.

The cross-sectional structure of the substrate SUB in which the emissive layers are not formed will be described below with reference to FIG. 14. The pads PD may be formed on the substrate SUB, and the substrate SUB may be defined in a state in which a printed circuit board is not connected. The pads PD may be connected to the above-described ground terminal, and the pads PD and the data lines DL1 to DLn may be grounded.

Figure 13:
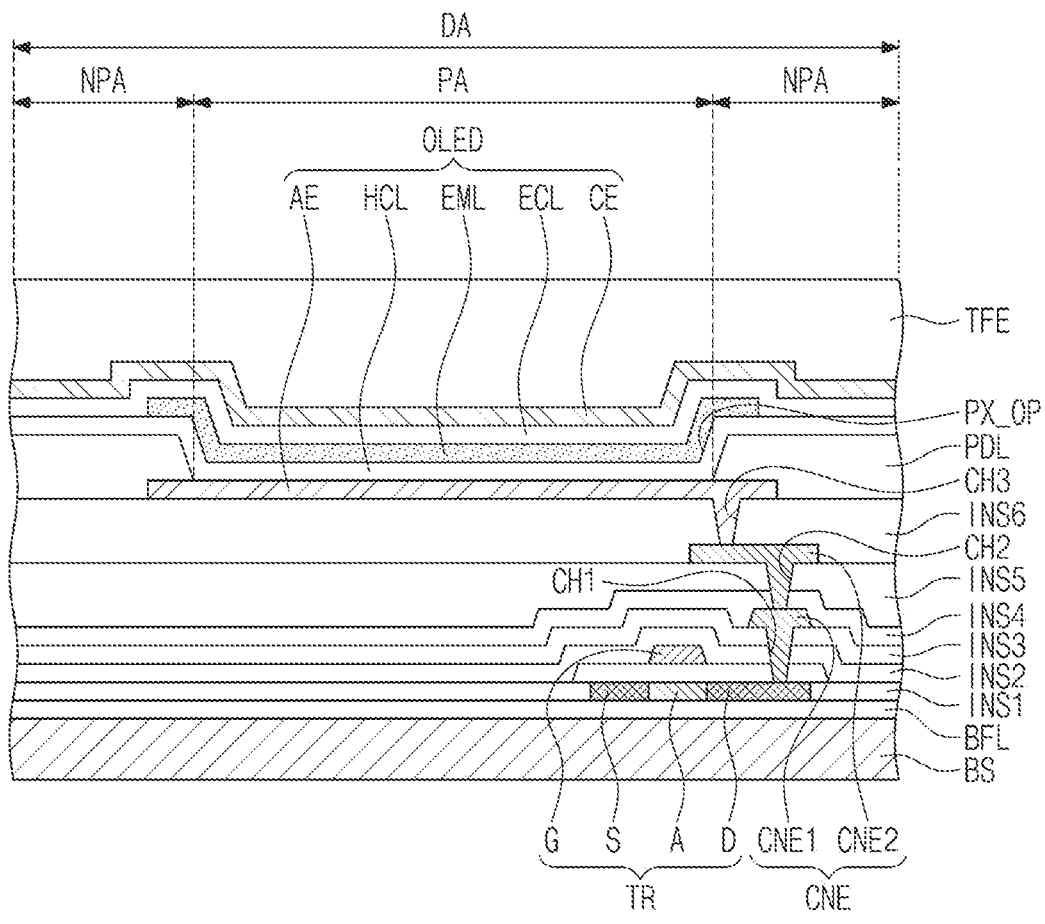
FIG. 13 is a sectional view of one of pixels illustrated in FIG. 12.

FIG. 13 is a sectional view of one of the pixels illustrated in FIG. 12.

Referring to FIG. 13, the pixel PX may be located on a base substrate BS and may include a transistor TR and a light-emitting element OLED. Transistors TR and light-emitting elements OLED of the pixels PX may be connected to the data lines DL1 to DLm and the first and second power lines PL1 and PL2.

The transistors TR and the light-emitting elements OLED of the pixels PX may be connected to the pads PD through the data lines DL1 to DLm and the first and second power lines PL1 and PL2. The transistors TR of the pixels PX may be connected to the pads PD through the data lines DL1 to DLm.

The light-emitting element OLED may include a first electrode AE, a second electrode CE, a hole control layer HCL, an electron control layer ECL, and an emissive layer EML. The first electrode AE may be an anode electrode, and the second electrode CE may be a cathode electrode.

The transistor TR and the light-emitting element OLED may be located on the base substrate BS. Although one transistor TR is illustrated, the pixel PX may substantially include a plurality of transistors and at least one capacitor for driving the light-emitting element OLED.

The display part DA may include an emissive part PA corresponding to the pixel PX and a non-emissive part NPA around the emissive part PA. The light-emitting element OLED may be located in the emissive part PA.

The base substrate BS may include a flexible plastic substrate. For example, the base substrate BS may include transparent polyimide (PI). A buffer layer BFL may be located on the base substrate BS. The buffer layer BFL may be an inorganic layer.

A semiconductor pattern may be located on the buffer layer BFL. The semiconductor pattern may include poly silicon. However, without being limited thereto, the semiconductor pattern may include amorphous silicon or metal oxide.

The semiconductor pattern may be doped with an N-type dopant or a P-type dopant. The semiconductor pattern may include a heavily doped area and a lightly doped area. The heavily doped area may have a higher conductivity than the lightly doped area and may substantially serve as a source electrode and a drain electrode of the transistor TR. The lightly doped area may substantially correspond to an active (or, channel) area of the transistor.

A source S, an active area A, and a drain D of the transistor TR may be formed from the semiconductor pattern. A first insulating layer INS1 may be located on the semiconductor pattern. A gate G of the transistor TR may be located on the first insulating layer INS1. A second insulating layer INS2 may be located on the gate G. A third insulating layer INS3 may be located on the second insulating layer INS2.

A connecting electrode CNE may be located between the transistor TR and the light-emitting element OLED, and may connect the transistor TR and the light-emitting element OLED. The connecting electrode CNE may include a first connecting electrode CNE1 and a second connecting electrode CNE2.

The first connecting electrode CNE1 may be located on the third insulating layer INS3, and may be connected to the drain D through a first contact hole CH1 defined in the first to third insulating layers INS1 to INS3. A fourth insulating layer INS4 may be located on the first connecting electrode CNE1. A fifth insulating layer INS5 may be located on the fourth insulating layer INS4.

The second connecting electrode CNE2 may be located on the fifth insulating layer INS5. The second connecting electrode CNE2 may be connected to the first connecting electrode CNE1 through a second contact hole CH2 defined in the fifth insulating layer INS5. A sixth insulating layer INS6 may be located on the second connecting electrode CNE2. The first to sixth insulating layers INS1 to INS6 may be inorganic layers or organic layers.

The first electrode AE may be located on the sixth insulating layer INS6. The first electrode AE may be connected to the second connecting electrode CNE2 through a third contact hole CH3 defined in the sixth insulating layer INS6. A pixel-defining film PDL exposing a portion (e.g., predetermined portion) of the first electrode AE may be located on the first electrode AE and the sixth insulating layer INS6. An opening PX-OP for exposing a portion (e.g., predetermined portion) of the first electrode AE may be defined in the pixel-defining film PDL.

The hole control layer HCL may be located on the first electrode AE and the pixel-defining film PDL. The hole control layer HCL may be commonly located in the emissive part PA and the non-emissive part NPA. The hole control layer HCL may include a hole transporting layer and a hole injection layer.

The emissive layer EML may be located on the hole control layer HCL. The emissive layer EML may be located in a region corresponding to the opening PX_OP. The emissive layer EML may include an organic material and/or an inorganic material. The emissive layer EML may generate any one of red light, green light, and blue light.

The electron control layer ECL may be located on the emissive layer EML and the hole control layer HCL. The electron control layer ECL may be commonly located in the emissive part PA and the non-emissive part NPA. The electron control layer ECL may include an electron transporting layer and an electron injection layer.

The second electrode CE may be located on the electron control layer ECL. The second electrode CE may be commonly located for the pixels PX. The layers from the buffer layer BFL to the light-emitting element OLED may be defined as a pixel layer PXL.

A thin-film encapsulation layer TFE may be located on the light-emitting element OLED. The thin-film encapsulation layer TFE may be located on the second electrode CE and may cover the pixel PX. The thin-film encapsulation layer TFE may include at least two inorganic layers and an organic layer between the inorganic layers. The inorganic layers may protect the pixel PX from moisture/oxygen. The organic layer may protect the pixel PX from foreign matter such as dust particles.

The first voltage may be applied to the first electrode AE through the transistor TR, and the second voltage having a lower level than the first voltage may be applied to the second electrode CE. Holes and electrons injected into the emissive layer EML may be combined to form excitons, and the light-emitting element OLED may emit light as the excitons transition to a ground state.

Figure 14:
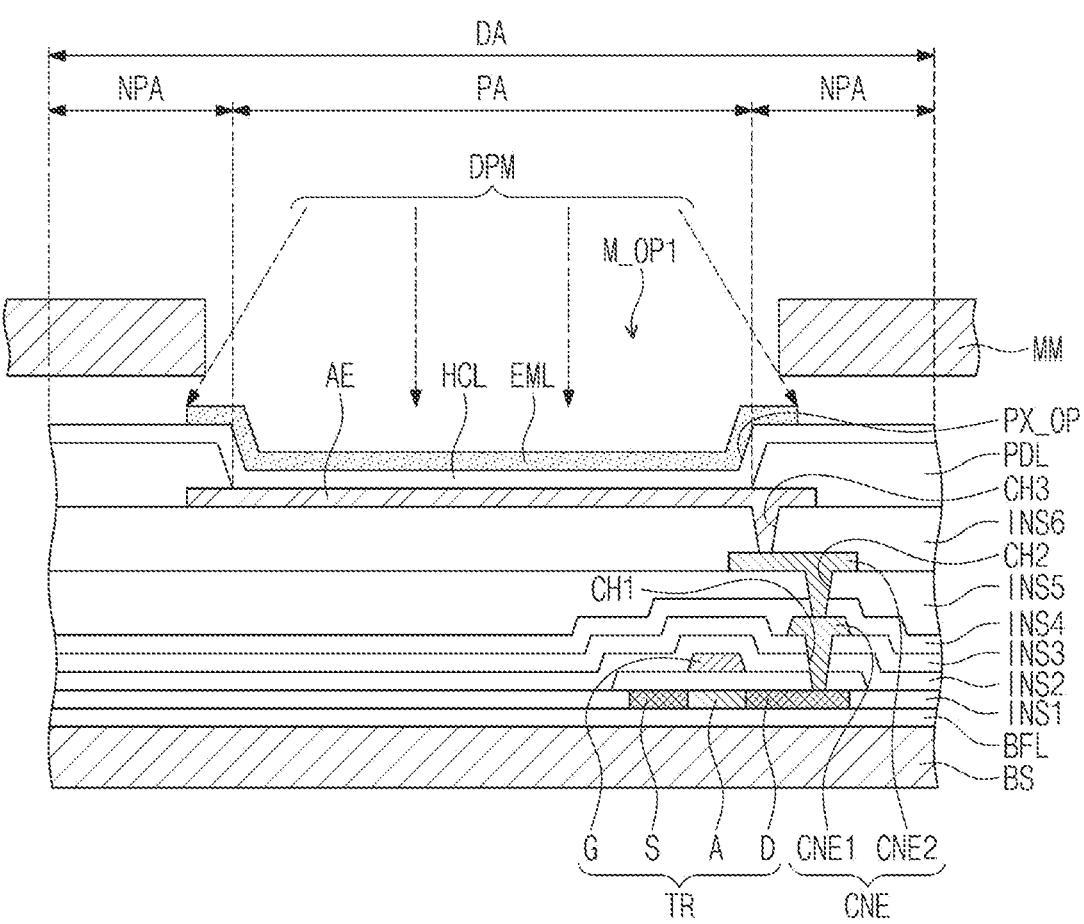
FIG. 14 is a view for describing a deposition process illustrated in FIG. 4D.

FIG. 14 is a view for describing the deposition process illustrated in FIG. 4H.

For convenience of description, the substrate SUB and the first masks MM1 illustrated in FIG. 4H are turned upside down in FIG. 14.

Referring to FIGS. 14 and 4H, it has been described that the deposition process is performed through the first masks MM1. However, without being limited thereto, a deposition material may be similarly or identically deposited on the substrate SUB through the second masks MM2.

The layers from the base substrate BS to the layer on which the first electrode AE is located may be defined as the substrate SUB. As described above, the transistors TR may be connected to the pads PD through the data lines DL1 to DLm. That is, the substrate SUB may include the data lines DL1 to DLm defined by the above-described lines, as well as the pads PD connected to the data lines DL1 to DLm.

The masks MM may be located to face the substrate SUB. The masks MM may be located adjacent to the substrate SUB. A deposition material DPM may be provided onto the substrate SUB through the first and second cell openings M_OP1 and M_OP2 defined on the upper surfaces of the masks MM. The first cell openings M_OP1 are illustrated in FIG. 14. The emissive layer EML may be formed on the substrate SUB by the deposition material DPM.

According to the embodiments of the present disclosure, the rotating part rotates the magnet units depending on the arrangement direction of the masks so that the arrangement of the first magnet units and the second magnet units is changed, and so that a repulsive force is not generated. Accordingly, defects due to weakening of close contact between the masks and the substrate during the deposition process may be reduced.

While the present disclosure has been described with reference to embodiments thereof, it will be apparent to those of ordinary skill in the art that various changes and modifications may be made thereto without departing from the spirit and scope of the present disclosure as set forth in the following claims, with functional equivalents thereof to be included therein.

What is claimed is:

1. A deposition apparatus comprising:
   a mask frame;
   masks on the mask frame;
   a magnet plate on the masks;
   a rotating part connected to a lower portion of the magnet plate; and magnet units, one of the magnet units connected to the rotating part, and configured to be rotated by the rotating part,
   wherein the rotating part is configured to rotate the one of the magnet units about a first rotational axis extending substantially perpendicularly to a plane defined by a first direction and a second direction crossing the first direction, and about a second rotational axis extending substantially parallel to the plane, and
   wherein the rotating part is configured to rotate the one of the magnet units such that polarities of the magnet units are arranged in a direction crossing an extension direction of the masks.

2. A deposition apparatus comprising:
   a mask frame;
   masks on the mask frame;
   a magnet plate on the masks;
   a rotating part connected to a lower portion of the magnet plate; and
   magnet units, one of the magnet units connected to the rotating part, and configured to be rotated by the rotating part,
   wherein, on a plane defined by a first direction and a second direction crossing the first direction, the rotating part is configured to rotate the one of the magnet units about a first rotational axis extending substantially perpendicularly to the plane, and about a second rotational axis extending substantially parallel to the plane.

3. The deposition apparatus of claim 2, wherein the magnet units are configured to be rotated by the rotating part such that polarities of the magnet units are arranged in a direction crossing an extension direction of the masks.

4. A deposition apparatus comprising:
   a mask frame;
   masks on the mask frame;
   a magnet plate on the masks;
   rotating parts connected to a lower portion of the magnet plate; and
   magnet units connected to the rotating parts in a one-to-one relationship, and each of the magnet units is configured to be rotated by the corresponding rotating part about a first rotational axis extending substantially perpendicularly to a plane defined by a first direction and a second direction crossing the first direction, and about a second rotational axis extending substantially parallel to the plane, such that polarities of the magnet units are arranged in a direction crossing an extension direction of the masks.

5. The deposition apparatus of claim 4, wherein the magnet units comprise:
   first magnet units having a first polarity; and
   second magnet units having a second polarity that is different from the first polarity.

6. The deposition apparatus of claim 5, wherein the second magnet units are on, and are connected to, the first magnet units, respectively.

7. The deposition apparatus of claim 6, wherein some of the first magnet units and some of the second magnet units are configured to be rotated by the rotating parts to face the masks.

8. The deposition apparatus of claim 7, wherein, when the masks are arranged in the first direction, and extend in the second direction:
   the first magnet units facing the masks are arranged in the first direction by the rotating parts; and
   the second magnet units facing the masks are spaced apart from the first magnet units in the second direction and are arranged in the first direction.

9. The deposition apparatus of claim 7, wherein, when the masks extend in the first direction, and are arranged in the second direction:
   the first magnet units facing the masks are arranged in the second direction by the rotating parts; and
   the second magnet units facing the masks are spaced apart from the first magnet units in the first direction and arranged in the second direction.

10. The deposition apparatus of claim 6, wherein each of the rotating parts is configured to rotate a respective pair of first and second magnet units stacked on each other about the first rotational axis.

11. The deposition apparatus of claim 10, wherein each of the rotating parts is configured to rotate the respective pair of the first and second magnet units about the second rotational axis.

12. The deposition apparatus of claim 11, wherein each of the rotating parts comprises:
   a first rotating unit connected to the magnet plate, and configured to rotate the respective pair of the first and second magnet units about the first rotational axis; and
   second rotating units connected to the first rotating unit, and configured to rotate the respective pair of the first and second magnet units about the second rotational axis.

13. The deposition apparatus of claim 12, wherein the first rotating unit is in a first depression defined on a lower surface of the magnet plate, and is connected to the magnet plate,
   wherein the respective pair of the first and second magnet units is in a second depression defined on a lower surface of the first rotating unit, and
   wherein the second rotating units are respectively connected to opposite sides of the first rotating unit, and to opposite sides of the respective pair of the first and second magnet units.

14. The deposition apparatus of claim 5, wherein the masks respectively comprise cell regions each having a periphery overlapping central portions of respective ones of the first and second magnet units.

15. The deposition apparatus of claim 5, wherein the second magnet units are connected to sides of the first magnet units, respectively, and
   wherein the first magnet units and the second magnet units are facing the masks.

16. The deposition apparatus of claim 15, wherein, when the masks are arranged in the first direction, and extend in the second direction, the first magnet units and the second magnet units are arranged in the first direction by the rotating parts.

17. The deposition apparatus of claim 15, wherein, when the masks are arranged in the second direction, and extend in the first direction, the first magnet units and the second magnet units are arranged in the second direction by the rotating parts.

18. The deposition apparatus of claim 15, wherein the rotating parts are configured to rotate a pair of the first and second magnet units, which are connected with each other, about a rotational axis that is substantially perpendicular to the plane.

19. The deposition apparatus of claim 18, wherein an $h^{th}$ pair of the first and second magnet units that are connected with each other, and an $(h+1)^{th}$ pair of the first and second magnet units that are connected with each other in the first direction or the second direction, may be configured to rotate in different respective directions, h being a natural number.

20. The deposition apparatus of claim 19, wherein the $h^{th}$ pair of the first and second magnet units and the $(h+1)^{th}$ pair of the first and second magnet units are located such that magnet units having a same polarity face each other.

21. The deposition apparatus of claim 4, wherein each of the magnet units has a square shape, sides of which have a length of about 10 mm, and a distance between one side of an $h^{th}$ magnet unit and one side of an $(h+1)^{th}$ magnet unit in the first direction or the second direction is about 14.2 mm.

\* \* \* \* \*